United States Patent
Miyazaki

(10) Patent No.: US 9,524,206 B2
(45) Date of Patent: Dec. 20, 2016

(54) DECODING DEVICE AND ERROR DETECTION METHOD

(71) Applicant: FUJITSU LIMITED, Kawasaki-shi, Kanagawa (JP)

(72) Inventor: Shunji Miyazaki, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 36 days.

(21) Appl. No.: 14/742,973

(22) Filed: Jun. 18, 2015

(65) Prior Publication Data
US 2016/0062822 A1   Mar. 3, 2016

(30) Foreign Application Priority Data
Aug. 28, 2014  (JP) ................. 2014-174476

(51) Int. Cl.
| | |
|---|---|
| H03M 13/00 | (2006.01) |
| G06F 11/10 | (2006.01) |
| H03M 13/37 | (2006.01) |
| H03M 13/09 | (2006.01) |
| H03M 13/29 | (2006.01) |

(52) U.S. Cl.
CPC ........ G06F 11/1004 (2013.01); H03M 13/093 (2013.01); H03M 13/2957 (2013.01); H03M 13/2975 (2013.01); H03M 13/3746 (2013.01)

(58) Field of Classification Search
CPC ........... G06F 11/1004; H03M 13/3746; H03M 13/093; H03M 13/2957; H03M 13/2975
See application file for complete search history.

(56) References Cited

U.S. PATENT DOCUMENTS 8,024,664 B1 * 9/2011 Marciel ................. G06Q 10/02
                                                                705/26.1
2004/0260995 A1   12/2004 Allpress
(Continued)

FOREIGN PATENT DOCUMENTS

EP        1487145       12/2004
JP      2002-100995     4/2002
(Continued)

OTHER PUBLICATIONS

Akira Shibutani, et al., "Complexity Reduction of Turbo Decoding", Proc. IEEE Veh. Conf. Oct. 1999, pp. 1570-1574 (5 pages).

*Primary Examiner* — Sam Rizk
(74) *Attorney, Agent, or Firm* — Fujitsu Patent Center

(57) ABSTRACT

A decoding device includes a decoding unit that iteratively obtains a decoded bit stream corresponding to an information bit stream of one block, and an error detection unit that divides the decoded bit stream into a plurality of sub-blocks, acquires a plurality of partial remainders respectively corresponding to the sub-blocks, and determines whether an error occurs in the decoded bit stream based on a total remainder in which the partial remainders are added, wherein the error detection unit, of the sub-blocks, acquires a first partial remainder corresponding to a first sub-block including bits in which values are different between a previous decoded bit stream and a current decoded bit stream, and determines whether the error occurs in the current decoded bit stream based on a current total remainder obtained by adding the acquired first partial remainder to a previous total remainder.

7 Claims, 11 Drawing Sheets

(56) References Cited

U.S. PATENT DOCUMENTS

2010/0138725 A1 6/2010 Ikeda
2010/0198892 A1 8/2010 Motozuka

FOREIGN PATENT DOCUMENTS

| | | |
|---|---|---|
| JP | 2005-006188 | 1/2005 |
| JP | 2005-6194 | 1/2005 |
| JP | 2006-523985 | 10/2006 |
| JP | 2009-136025 | 6/2009 |
| JP | 5126230 | 1/2013 |
| WO | 2004095711 | 11/2004 |
| WO | 2008023684 | 2/2008 |
| WO | 2009019763 | 2/2009 |

\* cited by examiner

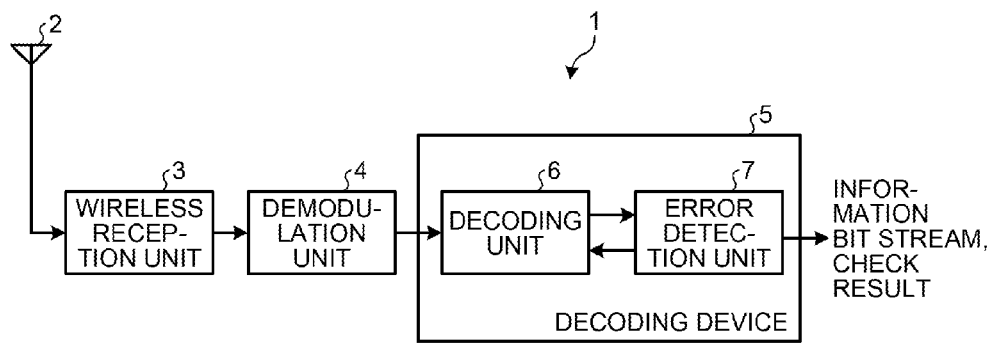
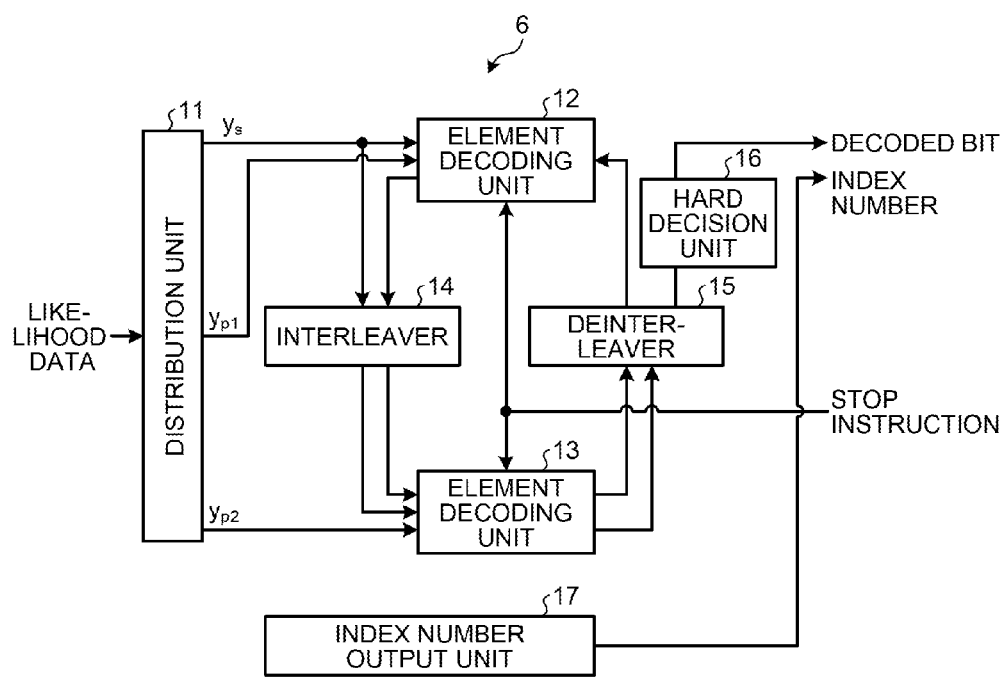

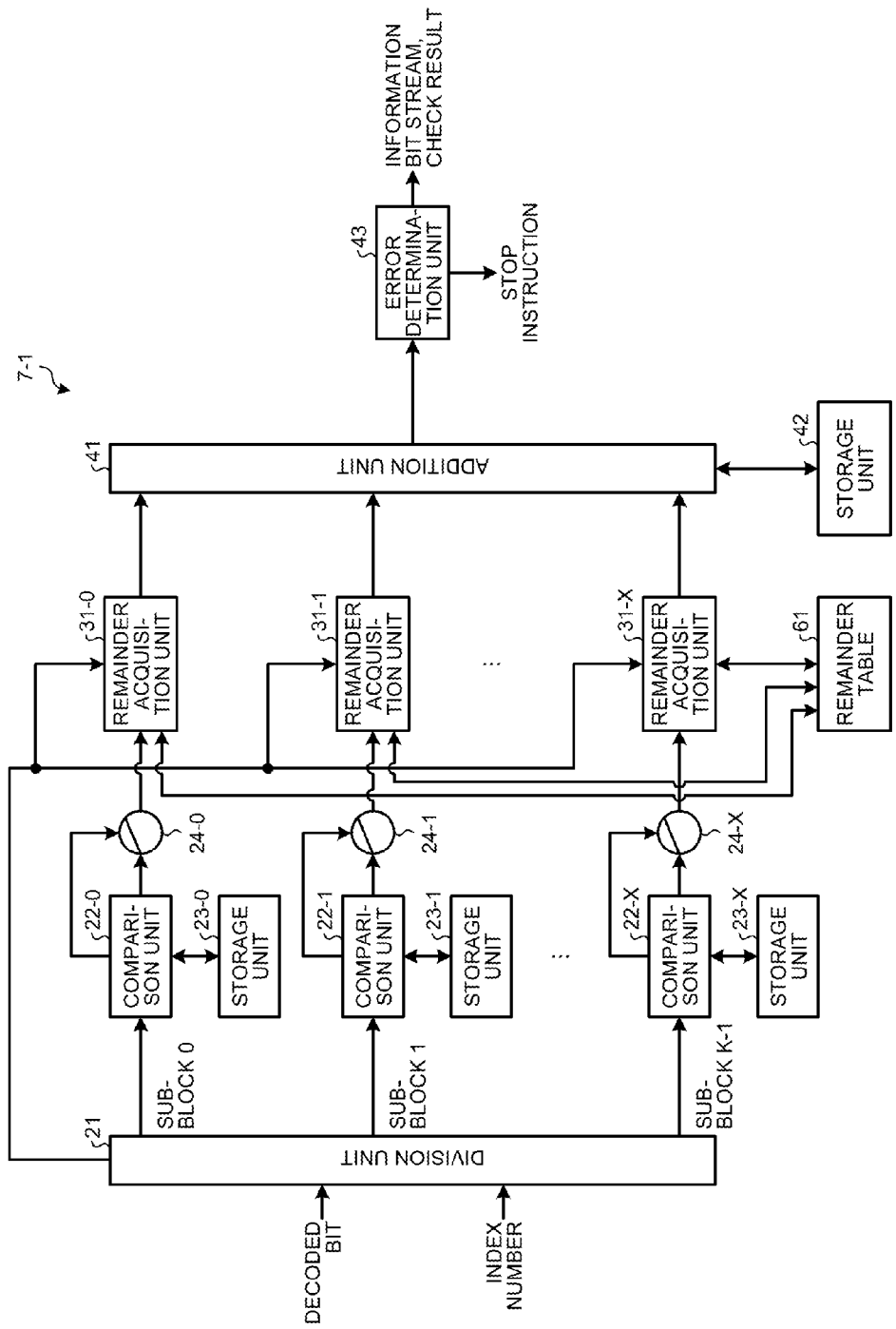

FIG.4

| BIT POSITION | REMAINDER VALUE |
|---|---|
| 0 | $r_{n0}$ |
| 1 | $r_{n1}$ |
| 2 | $r_{n2}$ |
| ⋮ | ⋮ |
| K-1 | $r_{nK-1}$ |

FIG.10

| BIT POSITION | REMAINDER VALUE |
|---|---|
| 0 | $r_{p0XP}$ |
| P | $r_{p1XP}$ |
| 2P | $r_{p2XP}$ |
| ⋮ | ⋮ |
| (K-1) P | $r_{pK-1XP}$ |

DECODING DEVICE AND ERROR DETECTION METHOD

CROSS-REFERENCE TO RELATED APPLICATION

This application is based upon and claims the benefit of priority of the prior Japanese Patent Application No. 2014-174476, filed on Aug. 28, 2014, the entire contents of which are incorporated herein by reference.

FIELD

The embodiments discussed herein are related to a decoding device and an error detection method.

BACKGROUND

In a data communication system desired to transmit data without any error and a storage device desired to perform data read without any error, and the like, an "error detection code" is used to detect a transmission error and a read error or so.

A "cyclic redundancy check (CRC) code" is one of error detection codes. In a data communication system for performing error detection using the CRC code, a transmission side adds an L-bit remainder obtained by dividing a polynomial corresponding to a K'-bit information bit stream by a generator polynomial for generating a CRC code to an information bit stream to form a K-bit encoded bit stream, and transmits the formed encoded bit stream to a reception side. Therefore, a bit side after the error detection encoding becomes "K=K'+L", and a remainder obtained by dividing the K-bit encoded bit stream by the generator polynomial becomes "0". "K" is an information bit size of one block, i.e., a block size. An L-bit remainder added to each block of the information bit is called a "parity bit".

The reception side divides the received encoded bit stream by the generator polynomial, determines that "no error occurs" if the remainder is "0" and that "an error occurs" if the remainder is a value "other than 0", and performs error detection on the received encoded bit stream.

For example, a polynomial $B(x)$ of the K'-bit information bit stream "$b=(a_0, \ldots, a_{k'-2}, a_{k'-1})$" is expressed by Equation (1).

$$B(x)=a_0 x^{K'}+\ldots+a_{K'-2}x+a_{K'-1} \tag{1}$$

A generator polynomial $G(x)$ is expressed by Equation (2).

$$G(x)=g_0 x^L+\ldots+g_{L-2}x+g_{L-1} \tag{2}$$

A remainder value $R_{crc}(x)$ obtained by dividing the polynomial $B(x)$ illustrated in Equation (1) by the generator polynomial $G(x)$ is expressed by Equation (3). The remainder value $R_{crc}(x)$ corresponds to the parity bit.

$$R_{crc}(x)=[x^L B(x)] \bmod G(x)=a_K x^{L-1}+\ldots+a_{K-2}x+a_{K-1} \tag{3}$$

By adding the $R_{crc}(x)$ in which a bit position is adjusted to $B(x)$, a polynomial $A(x)$ illustrated in Equation (4) is obtained. The $A(x)$ corresponds to a polynomial expression of a K-bit encoded bit stream "$a=(a_0, \ldots, a_{k-2}, a_{k-1})$" after the error detection encoding.

$$A(x)=x^L B(x)+R_{crc}(x)=a_0 x^K+\ldots+a_{K-2}x+a_{K-1} \tag{4}$$

The transmission side transmits the encoded bit stream expressed by the polynomial $A(x)$ to the reception side.

Here, the remainder when $A(x)$ is divided by $G(x)$ becomes "0". Therefore, if a quotient polynomial obtained by dividing $A(x)$ by $G(x)$ is $Q(x)$, then $A(x)$ is expressed by Equation (5).

$$A(x)=Q(x)G(x) \tag{5}$$

Because the encoded bit stream $A(x)$ transmitted from the transmission side is affected by noise or so on a transmission path, an error may be contained in an encoded bit stream $\hat{A}(x)$ received by the reception side. Therefore, the reception side calculates a remainder $\hat{R}(x)$ when the received encoded bit stream $\hat{A}(x)$ is divided by the generator polynomial $G(x)$, according to Equation (6).

$$\hat{R}(x)=\hat{A}(x) \bmod G(x) \tag{6}$$

The reception side determines that "no error occurs" in $\hat{A}(x)$ when $\hat{R}(x)$ becomes "0", and determines that "an error occurs" in $\hat{A}(x)$ when $\hat{R}(x)$ becomes a value "other than 0".

As a first related technology, there is an error detection device capable of performing error detection on an encoded bit stream, in which the order of the bits is randomized through interleaving, without changing the order and without deinterleaving. The error detection device previously calculates a remainder value when a polynomial corresponding to each bit position (i.e., each normal bit position) in the information bit stream before the interleave processing is divided by the generator polynomial and stores the calculated value in a memory. Each bit in the bit stream is randomly input and bit position information indicating normal bit positions of the bits is also input. The error detection device acquires each remainder value corresponding to the normal bit position of a bit, of the bits in the input bit stream, whose value is not 0 i.e. whose value is 1 from the memory, and cumulatively adds the acquired remainder values. When a cumulative addition result is "0", the error detection device determines that "no error occurs" in the input bit stream, and determines that "an error occurs" in the input bit stream when the cumulative addition result is a value "other than 0". In other words, the cumulative addition result of remainder values corresponding to normal bit positions of bits which are not 0, of the bits in the input bit stream, corresponds to $\hat{R}(x)$ in Equation (6).

As a second related technology, there is an error detection device capable of reducing the size of the memory in the first related technology. The error detection device stores only remainder values each corresponding to a bit position of "n×P" (n=1, 2, ... ) of the normal bit positions, where "P" is a predetermined bit interval. For an input bit stream, the error detection device calculates each remainder value corresponding to the "n×P" bit position of the normal bit positions from the memory, in the same manner as the first related technology. On the other hand, the error detection device calculates each remainder value corresponding to a bit position of "n×P+k" (0≤k<P) of the normal bit positions by shifting each remainder value corresponding to the bit position of "n×P" by k bit and dividing the shift result by the generator polynomial. The error detection device cumulatively adds the remainder values acquired from the memory and the remainder values calculated through the shifting and division, and determines whether an error occurs in the input bit stream based on the cumulative addition result, in the same manner as the first related technology.

Examples of related-art are described in Japanese Patent No. 5126230, in International Publication Pamphlet No. WO 2009/019763, in International Publication Pamphlet No. WO 2008/023684, in Japanese Laid-open Patent Publication No. 2009-136025, in Japanese Laid-open Patent Publication No. 2005-006188, in U.S. Patent Application No. 2010/0138725: Specification, in U.S. Patent Application No. 2010/0198892: Specification, and in A. Shibutani, H. Suda, and F. Adachi, "Complexity Reduction of Turbo Decoding", Proc. IEEE Veh. Tech. Conf. '99 Fall, October 1999.

To improve an error rate characteristic in the data communication system, forward error correction (FEC) may be performed on transmission data. A turbo code may be used as FEC. Moreover, a CRC code and a turbo code may be used in combination with each other. In this case, the transmission side performs turbo encoding on the bit stream after a parity bit or a CRC code is added thereto, and the reception side performs the CRC on the bit stream after turbo decoding. In the turbo decoding, reliability information of the decoding result is used to perform iterative decoding on the same received data. Therefore, in the turbo decoding, the error rate of the decoding result is getting smaller in each iteration of decoding, and an error is eliminated, that is, error free, in the decoding result at the time when the number of times of decoding reaches a certain number of times. Hereinafter, a bit stream after error detection encoding and error correction encoding may be called an "encoded bit stream" and each bit forming the encoded bit stream may be called an "encoded bit".

In the turbo decoding, particularly, when the error rate in the decoding result becomes small to be close to the error free, the bit whose value is changed from the previous decoding result is limited to some bits in the current decoding result. In other words, the value of the bit whose value is already corrected in the decoding before the last time is not changed, and the bit with the correct value continues to be the bit of the same value since the value is corrected.

On the other hand, when the CRC according to the first or the second related technology is merely applied to the decoding result of the turbo decoding, the acquisition of the same remainder value and the calculation of the same remainder value or the like are iteratively performed on the bit whose value is corrected through iterative decoding. In other words, the duplicate processing in the CRC is repeatedly performed in each iteration of the turbo decoding, and this causes unnecessary processing to occur in the CRC.

SUMMARY

According to an aspect of an embodiment, a decoding device includes a decoding unit that iteratively performs decoding on a same encoded bit stream transmitted by a wireless transmission device to iteratively obtain a decoded bit stream corresponding to an information bit stream of one block, and an error detection unit that divides the decoded bit stream into a plurality of sub-blocks, acquires a plurality of partial remainders respectively corresponding to the sub-blocks, and determines whether an error occurs in the decoded bit stream based on a total remainder in which the partial remainders are added, wherein the error detection unit acquires, from among the sub-blocks, a first partial remainder corresponding to a first sub-block including bits in which values are different between a previous decoded bit stream and a current decoded bit stream, but does not acquire a second partial remainder corresponding to a second sub-block in which all bits have same values between the previous decoded bit stream and the current decoded bit stream, and determines whether the error occurs in the current decoded bit stream based on a current total remainder obtained by adding the acquired first partial remainder to a previous total remainder.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a functional block diagram of an example of a wireless reception device according to a first embodiment;

FIG. 2 is a functional block diagram of an example of a decoding unit according to the first embodiment;

FIG. 3 is a functional block diagram of an example of an error detection unit according to the first embodiment;

FIG. 4 is a diagram of an example of a remainder table according to the first embodiment;

FIG. 10 is a diagram of an example of a remainder table according to the third embodiment;

DESCRIPTION OF EMBODIMENTS

Figure 5:
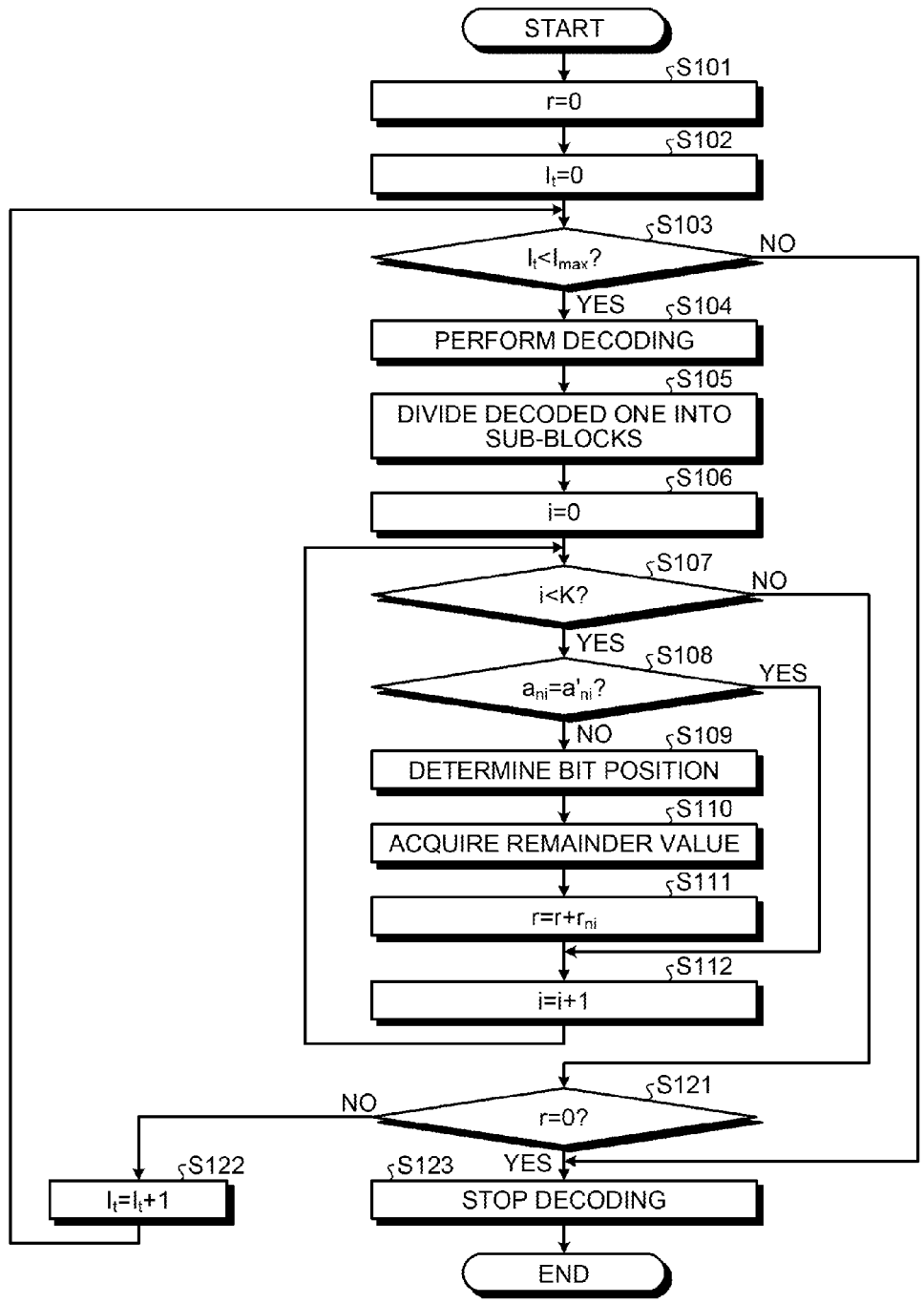
FIG. 5 is a flowchart for explaining the processing of a decoding device according to the first embodiment.

Preferred embodiments of the present invention will be explained with reference to accompanying drawings. The decoding device and the error detecting method disclosed in the present application are not limited by the following embodiments. Moreover, in the embodiments, the same reference signs are assigned to the components having the same functions and to the steps of performing the same processing, and overlapping explanation is omitted.

[a] First Embodiment

A remainder operation for calculating a remainder value R(x) when the polynomial A(x) illustrated in Equation (4) is divided by the generator polynomial G(x) can be expressed by Equation (7), and therefore the remainder operation becomes a "linear operation". In other words, the remainder value calculated by cumulatively adding the remainder values calculated by performing remainder operation using the generator polynomial for each bit position as performed in the second related technology becomes equivalent to the remainder value calculated by dividing the cumulative addition result of each remainder value in each bit position by the generator polynomial.

$$R(x) = A(x) \bmod G(x) = \left(\sum_{n=0}^{K-1} a_n x^n\right) \bmod G(x) = \sum_{n=0}^{K-1} a_n (x^n \bmod G(x)) \quad (7)$$

Because the remainder operation for calculating the remainder value R(x) becomes the linear operation as illustrated in Equation (7), a vector operation for calculating the remainder value R(x) can be expressed as linear transformation.

In other words, when a remainder value $R_n(x)$ with respect to a monomial is expressed by Equation (8), a remainder vector $r_n$ equivalent to Equation (8) can be expressed by Equation (9).

$$R_n(x) = x^n \bmod G(x) = r_{nL-1} x^{L-1} + \ldots + r_{n1} x + r_{n0} \qquad (8)$$

$$r_n = G_r e_n r_n = (r_{n0}, r_{n1}, \ldots, r_{nL-1})^T e_n = (0, \ldots 0, \overset{n}{1}, 0 \ldots 0)^T \qquad (9)$$

Where, $G_r$ in Equation (9) is expressed by Equation (10) using remainder values $r_0, r_1, \ldots, r_{K-1}$ corresponding to $n=0, 1, \ldots, K-1$ respectively.

$$G_r = [r_0, r_1, \ldots, r_{K-1}] \qquad (10)$$

As a result, if a vector r corresponding to R(x) is set as $r=(r_0, r_1, \ldots, r_L)$, then a remainder vector r corresponding to R(x) illustrated in Equation (7) is expressed by Equation (11).

$$r = G_r a = G_r \left( \sum_{n=0}^{K-1} a_n e_n \right) = \sum_{n=0}^{K-1} a_n (G_r e_n) = \sum_{n=0}^{K-1} a_n r_n \qquad (11)$$

When Equation (11) is generalized for a randomly input bit stream $a_{n1}$, the remainder vector r is expressed by Equation (12).

$$r = \sum_{i=0}^{K-1} a_{n_i} r_{n_i} \qquad (12)$$

Here, If $l=0, 1, 2, \ldots$ is set as an index indicating the order of iteration of turbo decoding, then a remainder vector $r^{(l)}$ obtained through CRC performed on an l-th decoding result is expressed by Equation (13).

$$r^{(l)} = \sum_{i=0}^{K-1} a_{n_i}^{(l)} r_{n_i} \qquad (13)$$

A remainder vector $r^{(l+1)}$ obtained through CRC performed on an l+1st decoding result is expressed by Equation (14) and Equation (15).

$$r^{(l+1)} = \sum_{i=0}^{K-1} a_{n_i}^{(l)} r_{n_i} + \sum_{i=0}^{K-1} (a_{n_i}^{(l+1)} + a_{n_i}^{(l)}) r_{n_i} = r^{(l)} + \sum_{i=0}^{K-1} \Delta a_{n_i}^{(l+1)} r_{n_i} \quad \text{where,} \qquad (14)$$

$$\Delta a_{n_i}^{(l+1)} = a_{n_i}^{(l+1)} + a_{n_i}^{(l)} \qquad (15)$$

All the operations in the CRC are arithmetic operations (four arithmetic operations in $GF(2)=\{0,1\}$, mod 2) performed on bit values. Therefore, in the left side of Equation (15), for bits at the same bit positions between an l-th (i.e., a previous time) decoding result and an l+1st (i.e., a current time) decoding result, if an l-th value and an l+1st value are the same as each other, then "0" is set, while if both of them are different from each other, then "1" is set.

Therefore, Equation (14) represents that the current remainder vector is obtained by additionally adding a remainder vector, only for the some bits whose values are different between the previous decoding result and the current decoding result, to the previously obtained remainder vector.

The embodiments are configured to acquire only some remainders corresponding to some bits in which the values are different between the previous decoding result and the current decoding result when error detection is currently performed. The acquired remainders are additionally added to the remainder used for the previous error detection, to calculate a remainder to be used for the current error detection.

Configuration of Wireless Reception Device

FIG. 1 is a functional block diagram of an example of a wireless reception device according to a first embodiment. As illustrated in FIG. 1, a wireless reception device 1 includes an antenna 2, a wireless reception unit 3, a demodulation unit 4, and a decoding device 5. The decoding device 5 includes a decoding unit 6 and an error detection unit 7.

The wireless reception unit 3 performs down-conversion and analog-digital conversion or so on the received wireless signal via the antenna 2 to obtain a baseband signal, and outputs the baseband signal to the demodulation unit 4.

The demodulation unit 4 performs demodulation processing on the baseband signal and outputs log-likelihood ratio data (hereinafter, it may be called "likelihood data") corresponding to each encoded bit to the decoding unit 6.

The decoding unit 6 performs error correction decoding using the likelihood data and outputs the decoding result to the error detection unit 7. The decoding unit 6 performs iterative decoding through, for example, turbo decoding on the same likelihood data obtained by the demodulation unit 4.

The error detection unit 7 performs error detection processing through, for example, CRC on the decoding result and outputs a check result and an information bit stream after the error detection processing. For example, when it is determined that "no error occurs" in the bit stream as the decoding result input from the decoding unit 6 (hereinafter, it may be called "decoded bit stream"), the error detection unit 7 outputs "0" as a check result and outputs "1" as a check result when it is determined that "an error occurs" in the decoded bit stream. In the following, each bit forming a decoded bit stream may be called a "decoded bit".

Configuration of Decoding Unit

FIG. 2 is a functional block diagram of an example of the decoding unit according to the first embodiment. As illustrated in FIG. 2, the decoding unit 6 includes a distribution unit 11, element decoding units 12 and 13, an interleaver 14, a deinterleaver 15, and a hard decision unit 16, and performs turbo decoding. In the turbo decoding, the element decoding units 12 and 13 perform iterative decoding in the following manner, thus improving a signal-noise ratio (SNR) of the likelihood data in each iteration of decoding.

Likelihood data $y_s$, $y_{p1}$, and $y_{p2}$ are input from the demodulation unit 4 to the distribution unit 11. The distribution unit 11 holds the likelihood data $y_s$, $y_{p1}$, and $y_{p2}$ corresponding to an information bit stream of one block until the information bits contained in the one block become error free. The distribution unit 11 outputs the likelihood data $y_s$ to the element decoding unit 12 and also to the element decoding unit 13 via the interleaver 14. The distribution unit 11 outputs the likelihood data $y_{p1}$ to the element decoding unit 12 and outputs the likelihood data $y_{p2}$ to the element decoding unit 13. In other words, the distribution unit 11 distributes the likelihood data $y_s$, $y_{p1}$, and $y_{p2}$ to the element decoding unit 12 and the element decoding unit 13. The likelihood data $y_s$ is likelihood data of a bit stream in which noise is added to an organization bit stream (i.e. information bit stream) transmitted by a transmission-side wireless transmission device on a transmission path. The likelihood data $y_{p1}$ is likelihood data of a bit stream in which noise is added to a parity bit stream 1 transmitted by the transmission-side wireless transmission device on the transmission path. The likelihood data $y_{p2}$ is likelihood data of a bit stream in which noise is added to a parity bit stream 2 transmitted by the transmission-side wireless transmission device on the transmission path.

The element decoding unit 12 uses a redundant bit of the likelihood data $y_{p1}$ and a posteriori probability calculated by the element decoding unit 13 to iteratively execute error correction decoding of the likelihood data $y_s$, and calculates a posteriori probability. The element decoding unit 12 uses the posteriori probability calculated by the element decoding unit 13 as a prior probability of the error correction decoding performed in the element decoding unit 12. The element decoding unit 12 outputs the calculated posteriori probability to the element decoding unit 13 via the interleaver 14.

The element decoding unit 13 uses a redundant bit of the likelihood data $y_{p2}$ and the posteriori probability calculated by the element decoding unit 12 to iteratively execute error correction decoding of the likelihood data $y_s$, and calculates a posteriori probability. The element decoding unit 13 uses the posteriori probability calculated by the element decoding unit 12 as the prior probability of the error correction decoding performed in the element decoding unit 13. The element decoding unit 13 outputs the calculated posteriori probability to the element decoding unit 12 via the deinterleaver 15. The element decoding unit 13 also outputs the calculated posteriori probability to the hard decision unit 16 via the deinterleaver 15.

The element decoding units 12 and 13 calculate posteriori probability following, for example, a Maximum A Posteriori Probability (MAP) decoding algorism or a soft output decoding algorithm such as a soft output Viterbi algorithm (SOVA).

The element decoding units 12 and 13 iteratively perform decoding until a stop instruction is received from the error detection unit 7. When receiving the stop instruction from the error detection unit 7, the element decoding units 12 and 13 stop decoding of a block to be decoded and start decoding for a next block. The stop instruction is output from the error detection unit 7 when the error detection unit 7 determines that "no error occurs" in the decoded bit stream. In this way, by stopping the decoding when no error is determined in the decoded bit stream, it is possible to reduce unnecessary processing such that the decoding is iterated after no error is detected in the decoded bit stream.

The hard decision unit 16 performs hard decision on the posteriori probability calculated by the element decoding unit 13, and outputs a hard decision result of "0" or "1". Therefore, the hard decision result obtained by the hard decision unit 16 becomes a decoded bit, and a decoded bit stream corresponding to an information bit stream of one block is iteratively obtained from the likelihood data $y_s$, $y_{p1}$, and $y_{p2}$ corresponding to the information bit stream of one block.

As explained above, the likelihood data $y_s$, $y_{p1}$, and $y_{p2}$ are likelihood data of the bit streams in which the noise is added to the organization bit stream and to the parity bit streams 1 and 2 respectively transmitted by the transmission-side wireless transmission device on the transmission path. The organization bit stream and the parity bit streams 1 and 2 are contained in the encoded bit stream. In other words, the decoding unit 6 uses the likelihood data $y_s$, $y_{p1}$, and $y_{p2}$ to iteratively perform decoding on the same encoded bit stream transmitted by the wireless transmission device.

The interleaver 14 performs replacement in the same order as an interleaver provided in a turbo encoder of the transmission-side wireless transmission device on the likelihood data $y_s$ and the posteriori probability calculated by the element decoding unit 12. The deinterleaver 15 performs replacement in reverse order to the interleaver 14 on the posteriori probability calculated by the element decoding unit 13.

An index number output unit 17 outputs an index number $n_i$ indicating a normal bit position of each decoded bit $a_{ni}$ in the decoded bit stream to the error detection unit 7 (i=0, 1, 2, ..., K−1). The "normal bit position" is a position of each bit in one block before the order of the bits in the information bit stream of one block is interleaved.

Configuration of Error Detection Unit

FIG. 3 is a functional block diagram of an example of an error detection unit according to the first embodiment. As illustrated in FIG. 3, an error detection unit 7-1 includes a division unit 21, comparison units 22-0 to 22-X, storage units 23-0 to 23-X, switches 24-0 to 24-X, and remainder acquisition units 31-0 to 31-X. In FIG. 3, "X=K−1". The error detection unit 7-1 also includes a remainder table 61, an addition unit 41, a storage unit 42, and an error determination unit 43. The error detection unit 7-1 illustrated in FIG. 3 corresponds to the error detection unit 7 illustrated in FIG. 1.

Each decoded bit $a_{ni}$ in the decoded bit stream is input to the division unit 21 and the index number $n_i$ indicating the normal bit position of each decoded bit $a_{ni}$ is also input thereto (i=0, 1, 2, ..., K−1). The division unit 21 divides the decoded bit streams $a_{n0}$ to $a_{nK-1}$ corresponding to the information bit stream of one block into a plurality of sub-blocks i (i=0, 1, 2, ..., K−1), and outputs decoded bits forming each sub-block to the comparison units 22-0 to 22-X in parallel. Here, the block size of the sub-block is set as "1 bit". In other words, each sub-block after the division by the division unit 21 is formed with a decoded bit of one bit. For example, the sub-block 0 is formed only with the decoded bit $a_{n0}$, and the decoded bit $a_{n0}$ is output to the comparison unit 22-0.

The division unit 21 outputs the respective index numbers of the decoded bits, which are output to the comparison units 22-0 to 22-X in parallel, to the remainder acquisition units 31-0 to 31-X, respectively. For example, the division unit 21 outputs an index number $n_0$ of the decoded bit $a_{n0}$ output to the comparison unit 22-0 to the remainder acquisition unit 31-0.

The comparison units 22-0 to 22-X and the storage units 23-0 to 23-X correspond to the sub-blocks 0 to K−1 respectively. The comparison units 22-0 to 22-X turn on the switches 24-0 to 24-X for initially obtained decoded bit streams, respectively, of the decoded bit streams iteratively obtained from the likelihood data $y_s$, $y_{p1}$, and $y_{p2}$ corresponding to the information bit stream of one block, so that the comparison units 22-0 to 22-X and the remainder acquisition units 31-0 to 31-X are connected to each other respectively. Thereby the decoded bits of the initially obtained decoded bit stream are output from the comparison units 22-0 to 22-X to the remainder acquisition units 31-0 to 31-X without any change, respectively. The comparison units 22-0 to 22-X store the decoded bits of the initially obtained decoded bit stream in the storage units 23-0 to 23-X respectively. Thus, for example, the storage unit 23-0 stores the decoded bit $a_{n0}$.

Each of the comparison units 22-0 to 22-X compares the value of the currently obtained decoded bit with the value of the previously obtained decoded bit for the decoded bit stream obtained through second and subsequent decoding. The previously obtained decoded bits are stored in the storage units 23-0 to 23-X. When the previous value and the current value of the decoded bits are different from each other, the comparison units 22-0 to 22-X turn on the switches 24-0 to 24-X, so that the comparison units 22-0 to 22-X and the remainder acquisition units 31-0 to 31-X are connected to each other respectively. On the other hand, when the previous value and the current value of the decoded bits match each other, the comparison units 22-0 to 22-X turn off the switches 24-0 to 24-X, so that the comparison units 22-0 to 22-X and the remainder acquisition units 31-0 to 31-X are not connected to each other respectively. Therefore, when the previous value and the current value of the decoded bits are different from each other, the decoded bits are input to the remainder acquisition units 31-0 to 31-X, and each of the remainder acquisition units 31-0 to 31-X acquires the remainder value. On the other hand, when the previous value and the current value of the decoded bits match each other, the decoded bits are not input to the remainder acquisition units 31-0 to 31-X, and each of the remainder acquisition units 31-0 to 31-X does not acquire the remainder value.

For example, the comparison unit 22-0 turns on the switch 24-0 when the value of a previously obtained decoded bit $a_{n0}^{(l)}$ and the value of a currently obtained decoded bit $a_{n0}^{(l+1)}$ are different from each other. On the other hand, the comparison unit 22-0 turns off the switch 24-0 when the value of the previously obtained decoded bit $a_{n0}^{(l)}$ and the value of the currently obtained decoded bit $a_{n0}^{(l+1)}$ match each other. Also for example, the comparison unit 22-1 turns on the switch 24-1 when the value of a previously obtained decoded bit $a_{n1}^{(l)}$ and the value of a currently obtained decoded bit $a_{n1}^{(l+1)}$ are different from each other. On the other hand, the comparison unit 22-1 turns off the switch 24-1 when the value of the previously obtained decoded bit $a_{n1}^{(l)}$ and the value of the currently obtained decoded bit $a_{n1}^{(l+1)}$ match each other.

For the second and subsequent decoding, the comparison units 22-0 to 22-X sequentially update the decoded bits stored in the storage units 23-0 to 23-X respectively with the decoded bits in the decoded bit stream obtained by each decoding. It may be determined whether the previous value and the current value of the decoded bits match each other according to Equation (15).

There are no previously obtained decoded bits with respect to the decoded bits in the initially obtained decoded bit stream, and, therefore, at the time of the initial decoding, the values of the currently obtained decoded bits do not always coincide with the values of the previously obtained decoded bits.

The remainder table 61 stores L-bit remainder values $r_{nl}$ (corresponding to the remainder vectors $r_n$ illustrated in Equation (9)) respectively corresponding to the normal bit positions $n_i$ of the bits $a_{ni}$. FIG. 4 is a diagram of an example of a remainder table according to the first embodiment. For example, as illustrated in FIG. 4, the remainder table 61 stores remainder values $r_{n0}, r_{n1}, r_{n2}, \ldots, r_{nk-1}$ associated with the bit positions 0, 1, 2, K−1 respectively. The remainder value $r_{ni}$ corresponding to the normal bit position $n_i$ of each bit $a_{ni}$ can be previously calculated according to Equation (8) and Equation (9). In other words, the remainder table 61 stores remainder values $R_n(X)$, as $r_n$, when a monomial $x^n$ corresponding to each bit position in the bit stream expressed by the polynomial A(x) is divided by the generator polynomial G(x).

The remainder acquisition units 31-0 to 31-X correspond to the sub-blocks 0 to K−1, respectively. The remainder acquisition units 31-0 to 31-X acquire L-bit remainder values from the remainder table 61, when the decoded bits are input from the comparison units 22-0 to 22-X, based on each index number $n_i$ of the decoded bits $a_{ni}$ and acquire "partial remainders" corresponding to the decoded bits $a_{ni}$. The remainder acquisition units 31-0 to 31-X output the acquired partial remainders to the addition unit 41. Here, the block size of the sub-block is 1 bit, and therefore the remainder acquisition unit 31-0 outputs the partial remainder corresponding to the sub-block 0 to the addition unit 41, the remainder acquisition unit 31-1 outputs the partial remainder corresponding to the sub-block 1 to the addition unit 41, and the remainder acquisition unit 31-X outputs the partial remainder corresponding to the sub-block K−1 to the addition unit 41. In other words, each of the remainder acquisition units 31-0 to 31-X functions as a partial-remainder acquisition unit. However, when decoding is initially performed, each of the remainder acquisition units 31-0 to 31-X acquires a remainder value corresponding to the decoded bit whose value is 1, but does not acquire a remainder value corresponding to the decoded bit whose value is 0.

On the other hand, the remainder acquisition units 31-0 to 31-X do not acquire remainder values from the remainder table 61 (i.e., do not acquire partial remainders) when the decoded bits are not input from the comparison units 22-0 to 22-X.

In this way, the error detection unit 7-1 acquires the remainder value corresponding to the decoded bit from the remainder table 61 based on the index number. By thus doing, the error detection unit 7-1 can perform error detection on the encoded bit stream, in which the order thereof is randomized through the interleave, in the same order as they are without deinterleaving. Therefore, the processing time for the error detection can be reduced, and the decoding by the decoding unit 6 can thereby be stopped early.

The addition unit 41 adds all the acquired partial remainders at the time of the initial decoding to calculate a "total remainder", and stores the calculated total remainder in the storage unit 42.

The addition unit 41 adds the acquired partial remainder to the previous total remainder stored in the storage unit 42 at the time of the second and subsequent decoding, and calculates a current total remainder. The previous total remainder corresponds to $r^{(l)}$ illustrated in Equation (13), and the current total remainder corresponds to $r^{(l+1)}$ illustrated in Equation (14). The addition unit 41 outputs the calculated current total remainder to the error determination unit 43 and updates the previous total remainder stored in the storage unit 42 with the calculated current total remainder.

The error determination unit 43 determines that "no error occurs" in the decoded bit stream when the current total remainder calculated by the addition unit 41 is "0", and determines that "an error occurs" in the decoded bit stream when the current total remainder calculated by the addition unit 41 is a value "other than 0". The error determination unit 43 outputs the information bit stream after the CRC and outputs the value corresponding to the determination result as a check result. For example, the error determination unit 43 outputs "0" as a check result when it is determined that "no error occurs" in the decoded bit stream, and outputs "1"

as a check result when it is determined that "an error occurs" in the decoded bit stream. The error determination unit 43 outputs a stop instruction of the decoding to the decoding unit 6 when it is determined that "no error occurs" in the decoded bit stream.

As explained above, in the error detection unit 7-1, the remainder acquisition units 31-0 to 31-X acquire a plurality of remainder values respectively corresponding to the sub-blocks 0 to K−1, in each of which the block size is 1 bit, from the remainder table 61, and acquire a plurality of partial remainders respectively corresponding to the sub-blocks 0 to K−1. The error determination unit 43 determines whether an error occurs in the decoded bit stream based on the total remainder obtained by adding the acquired partial remainders. However, each of the remainder acquisition units 31-0 to 31-X acquires only a partial remainder corresponding to a sub-block including bits in which values are changed between the previous decoding and the current decoding, based on comparison results in the comparison units 22-0 to 22-X. In other words, each of the remainder acquisition units 31-0 to 31-X acquires, from among the sub-blocks, a partial remainder corresponding to a sub-block including bits in which values are different between the previous decoded bit stream and the current decoded bit stream. On the other hand, each of the remainder acquisition units 31-0 to 31-X does not acquire, from among the sub-blocks, a partial remainder corresponding to a sub-block in which all the bits (1 bit, herein) have the same values between the previous decoded bit stream and the current decoded bit stream. The error determination unit 43 determines whether an error occurs in the current decoded bit stream based on the current total remainder obtained by adding the acquired partial remainder to the previous total remainder.

By doing this, it is possible to perform error detection on the current decoded bit stream without acquiring the partial remainders corresponding to the sub-block in which the values of all the bits (1 bit, herein) are not changed between the previous decoding and the current decoding. Therefore, the throughput related to the error detection can be reduced.

For example, in the first related technology, a remainder value of the decoded bit whose value is 1 is acquired each time the decoding is performed, while a remainder value of the decoded bit whose value is 0 is not acquired. It is considered that the number of bits whose value is 1 and the number of bits whose value is 0 are substantially equal to each other on average in the decoded bit stream. In other words, about 50% of bit values is 1. Therefore, if the block size of the decoded bit stream is K bits and a throughput per bit is X, then the throughput according to the first related technology can be expressed as "X×K×0.5".

On the other hand, according to a simulation, in the current decoded bit stream, a proportion of the decoded bit whose value is changed from the previous decoded bit stream was about 20%. Therefore, the throughput according to the first embodiment when it is compared with the throughput according to the first related technology can be expressed as "X×K×0.2", and this is 40% of the throughput in the first related technology. In other words, according to the first embodiment, 60% of the processing can be reduced in the error detection as compared with that of the first related technology.

Processing of Error Detection Device

FIG. 5 is a flowchart for explaining the processing of the decoding device according to the first embodiment. The flowchart illustrated in FIG. 5 is started when the encoded bit stream corresponding to information bit stream of one block is decoded.

First of all, the decoding device 5 resets the total remainder r to 0 (Step S101), and resets the value of a counter $I_t$ indicating the number of iterations of decoding to 0 (Step S102).

Subsequently, the decoding device 5 determines whether the value of $I_t$ is less than $I_{max}$ (Step S103). The value of $I_{max}$ represents a predetermined maximum number of iterations, and is set to, for example, "16".

When the value of $I_t$ becomes $I_{max}$ or more (No at Step S103), the decoding device 5 stops the decoding (Step S123) and ends the processing.

When the value of $I_t$ is less than $I_{max}$ (Yes at Step S103), the decoding device 5 performs decoding on the encoded bit stream to obtain a decoded bit stream corresponding to the information bit stream of one block (Step S104).

Subsequently, the decoding device 5 divides the decoded bit stream into K sub-blocks (Step S105).

The decoding device 5 then resets the value of a counter i to 0 (Step S106).

Subsequently, the decoding device 5 determines whether the value of i is less than K (Step S107).

When the value of i is less than K (Yes at Step S107), the decoding device 5 determines whether the value of the current decoded bit $a_{ni}$ is the same as the value of a previous decoded bit $a'_{ni}$ (Step S108).

When the value of the current decoded bit $a_{ni}$ is the same as the value of the previous decoded bit $a'_{ni}$ (Yes at Step S108), the decoding device 5 does not perform the processing of Steps S109 to S111, and the processing proceeds to Step S112.

When the value of the current decoded bit $a_{ni}$ is different from the value of the previous decoded bit $a'_{ni}$ (No at Step S108), the decoding device 5 determines the normal bit position $n_i$ of the current decoded bit $a_{ni}$ (Step S109).

Subsequently, the decoding device 5 acquires the remainder value $r_{ni}$ corresponding to the bit position $n_i$ determined at Step S109 and sets the value as a partial remainder (Step S110).

The decoding device 5 then adds the partial remainder $r_{ni}$ to the total remainder r to calculate a new total remainder r (Step S111).

Subsequently, the decoding device 5 increments the value of the counter i by 1 (Step S112), and the processing returns to Step S107.

Then, when the processing of Steps S108 to S111 is repeated by K times and the value of i becomes K or more (No at Step S107), the decoding device 5 determines whether an error occurs in the decoded bit stream based on the total remainder r (Step S121). In other words, the decoding device 5 determines that "no error occurs" in the decoded bit stream when the total remainder r is 0, and determines that "an error occurs" in the decoded bit stream when the total remainder r is not 0 (Step S121).

When the total remainder r is not 0 (No at Step S121), the decoding device 5 increments the value of the counter $I_t$ by 1 (Step S122), and the processing returns to Step S103.

When the total remainder r is 0 (Yes at Step S121), and the decoding device 5 stops the decoding (Step S123) and ends the processing.

[b] Second Embodiment

When an encoded bit stream whose bit size is K bits is divided into M sub-blocks whose block size is W bits (where W is "2" or more), W and K are expressed by Equation (16). Where, K is assumed to be divisible by M.

$$W=K/M, K=M\times W \quad (16)$$

When the encoded bit stream for each sub-block is expressed using a polynomial $A_m(x)$ for each sub-block, the following Equation (17) is obtained. Where, m=0, 1, ..., M−1.

$$A_m(x)=a_{mW}x^{K-mW+W-1}+\ldots+a_{mW+W-2}x^{K-mW+1}+a_{mW+W-1}x^{K-mW} \quad (17)$$

As a result, the polynomial A(x) of the entire encoded bit stream is expressed by Equation (18).

$$A(x)=a_0 x^{K-1}+\cdots+a_{K-2}x+a_{K-1}=\sum_{m=0}^{M-1}A_m(x) \quad (18)$$

As a result, the remainder value R(x) when the polynomial A(x) illustrated in Equation (18) is divided by the generator polynomial G(x) is expressed by Equation (19) and Equation (20).

$$R(x)=A(x)\mathrm{mod}G(x)=\left(\sum_{m=0}^{M-1}A_m(x)\right)\mathrm{mod}G(x)=\sum_{n=0}^{K-1}P_m(x) \text{ where,} \quad (19)$$

$$P_m(x)=A_m(x)\mathrm{mod}G(x) \quad (20)$$

Therefore, the second embodiment is configured to divide the encoded bit stream into M sub-blocks whose block size is W bits (where W is "2" or more) and calculate M partial remainders $P_{m(x)}$ corresponding to the sub-blocks in parallel.

Configuration of Error Detection Unit

Figure 6:
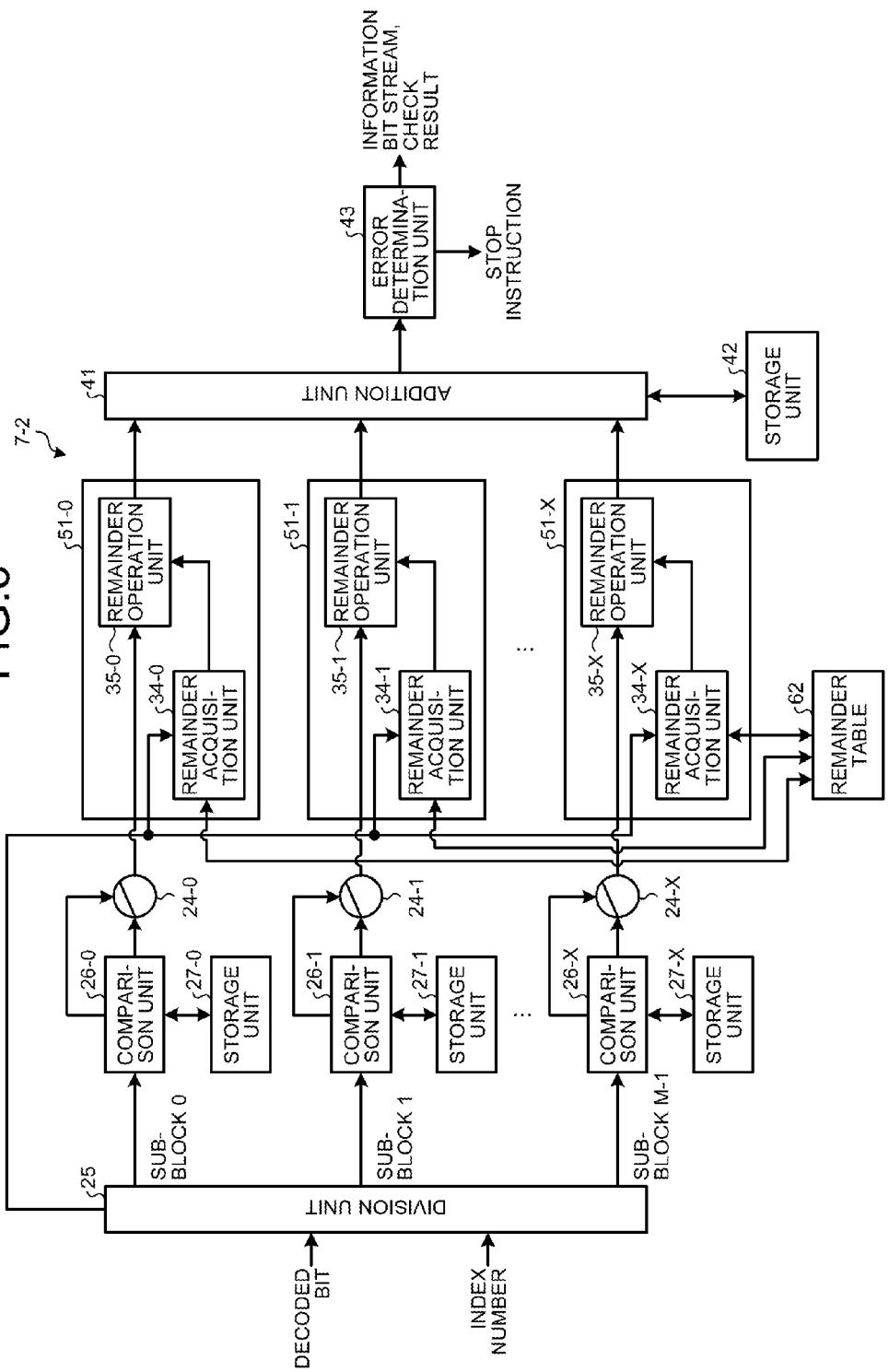
FIG. 6 is a functional block diagram of an example of an error detection unit according to a second embodiment.

FIG. 6 is a functional block diagram of an example of an error detection unit according to the second embodiment. As illustrated in FIG. 6, an error detection unit 7-2 includes a division unit 25, comparison units 26-0 to 26-X, storage units 27-0 to 27-X, the switches 24-0 to 24-X, and partial-remainder acquisition units 51-0 to 51-X. The partial-remainder acquisition unit 51-0 includes a remainder acquisition unit 34-0 and a remainder operation unit 35-0, the partial-remainder acquisition unit 51-1 includes a remainder acquisition unit 34-1 and a remainder operation unit 35-1, and the partial-remainder acquisition unit 51-X includes a remainder acquisition unit 34-X and a remainder operation unit 35-X. In FIG. 6, "X=M−1". "M" is the number of sub-blocks. The error detection unit 7-2 also includes a remainder table 62, the addition unit 41, the storage unit 42, and the error determination unit 43. The error detection unit 7-2 illustrated in FIG. 6 corresponds to the error detection unit 7 illustrated in FIG. 1.

Each decoded bit $a_{ni}$ in the decoded bit stream is input to the division unit 25 and the index number $n_i$ indicating the normal bit position of each decoded bit $a_{ni}$ is also input thereto (i=0, 1, 2, ..., K−1). The division unit 25 divides the decoded bit streams $a_{n0}$ to $a_{nK-1}$ corresponding to the information bit stream of one block into a plurality of sub-blocks i (i=0, 1, 2, ..., M−1), and outputs decoded bits included in the sub-blocks to the comparison units 26-0 to 26-X in parallel in order from a first decoded bit in each sub-block. Here, the block size of the sub-block is W bits (where W is "2" or more). Therefore, for example, the decoded bits included in the sub-block 0 are output to the comparison unit 26-0, and the decoded bits included in the sub-block 1 are output to the comparison unit 26-1. Also for example, the sub-block 0 is formed from the decoded bits $a_0$, $a_1$, ..., and $a_{W-1}$, and the decoded bits $a_0$, $a_1$, ..., and $a_{W-1}$ are output to the comparison unit 26-0 in a serial order from $a_0$.

The division unit 25 outputs index numbers of the first decoded bits in the sub-blocks, of the decoded bits output in parallel to the comparison units 26-0 to 26-X, to the remainder acquisition units 34-0 to 34-X respectively. For example, the division unit 25 outputs an index number 0 of the decoded bit $a_0$, which is output to the comparison unit 26-0, to the remainder acquisition unit 34-0.

The comparison units 26-0 to 26-X and the storage units 27-0 to 27-X correspond to the sub-blocks 0 to M−1 respectively. The comparison units 26-0 to 26-X turn on the switches 24-0 to 24-X for initially obtained decoded bit streams, respectively, of the decoded bit streams iteratively obtained from the likelihood data $y_s$, $y_{p1}$, and $y_{p2}$ corresponding to the information bit stream of one block, so that the comparison units 26-0 to 26-X and the remainder operation units 35-0 to 35-X are connected to each other respectively. The decoded bits of the initially obtained decoded bit stream are output from the comparison units 26-0 to 26-X to the remainder operation units 35-0 to 35-X in unit of sub-block without any change, respectively. The comparison units 26-0 to 26-X store the decoded bits of the initially obtained decoded bit streams in the storage units 27-0 to 27-X respectively for each sub-block. Thus, for example, the storage unit 27-0 stores the decoded bits $a_0$, $a_1$, ..., and $a_{W-1}$ that form the sub-block 0.

For the decoded bit streams obtained through the second and subsequent decoding, each of the comparison units 26-0 to 26-X compares the value of the currently obtained decoded bit with the value of the previously obtained decoded bit. The previously obtained decoded bits are stored in the storage units 27-0 to 27-X for each sub-block. When there are decoded bits in which the previous value and the current value are different from each other in each of the sub-blocks corresponding to the comparison units 26-0 to 26-X respectively, the comparison units 26-0 to 26-X turn on the switches 24-0 to 24-X, so that the comparison units 26-0 to 26-X and the remainder operation units 35-0 to 35-X are connected to each other respectively. On the other hand, when there are no decoded bits in which the previous value and the current value are different from each other in each of the sub-blocks corresponding to the comparison units 27-0 to 27-X respectively, that is, when all the previous and current decoded bits in the sub-block have the same values as each other, the comparison units 26-0 to 26-X turn off the switches 24-0 to 24-X, so that the comparison units 26-0 to 26-X and the remainder operation units 35-0 to 35-X are not connected to each other respectively. Therefore, when there are decoded bits in which the previous value and the current value are different from each other in each of the sub-blocks, the decoded bits in the sub-blocks are input to the remainder operation units 35-0 to 35-X, and the remainder operation is performed thereon by the remainder operation units 35-0 to 35-X respectively. On the other hand, when all the previous and current decoded bits in each of the sub-blocks have the same values as each other, the decoded bits in the sub-blocks are not input to the remainder operation units 35-0 to 35-X, and the remainder operation is not performed thereon by the remainder operation units 35-0 to 35-X respectively.

For example, the comparison unit 26-0 turns on the switch 24-0 when there are decoded bits in which the previous value and the current value are different from each other in the sub-block 0. On the other hand, the comparison unit 26-0 turns off the switch 24-0 when the previous values and the current values of all the decoded bits are the same as each other in the sub-block 0. Also for example, the comparison unit 26-1 turns on the switch 24-1 when there are decoded bits in which the previous value and the current value are different from each other in the sub-block 1. On the other hand, the comparison unit 26-1 turns off the switch 24-1 when the previous values and the current values of all the decoded bits are the same as each other in the sub-block 1.

For the second and subsequent decoding, the comparison units 26-0 to 26-X sequentially update the decoded bits in the sub-blocks stored in the storage units 27-0 to 27-X with the decoded bits in the sub-blocks obtained through each decoding, respectively.

There are no previously obtained decoded bits with respect to the decoded bits in the initially obtained decoded bit stream, and, therefore, at the time of the initial decoding, the values of the currently obtained decoded bits do not always coincide with the values of the previously obtained decoded bits.

The remainder table 62 stores remainder values) $P_m^{(0)}$ for each sub-block calculated by Equation (21), as initial values of the remainder operation for each sub-block, associated with index numbers of the first decoded bits in each of the sub-blocks.

$$P_m^0(x) = x^{K-(m-1)W} \bmod G(x) \quad (21)$$

The remainder acquisition units 34-0 to 34-X correspond to the sub-blocks 0 to M−1 respectively. When each first decoded bit in the sub-blocks is input from the comparison units 26-0 to 26-X, the remainder acquisition units 34-0 to 34-X acquire an L-bit remainder value $P_m^{(0)}$ from the remainder table 62 based on each index number of the first decoded bits. For example, the remainder acquisition unit 34-0 acquires a remainder value $P_0^{(0)}$ based on the index number of the first decoded bit in the sub-block 0, and the remainder acquisition unit 34-1 acquires a remainder value $P_1^{(0)}$ based on the index number of the first decoded bit in the sub-block 1. The remainder acquisition units 34-0 to 34-X set the acquired remainder value $P_m^{(0)}$ as an initial value of the remainder operation for each sub-block in the remainder operation units 35-0 to 35-X respectively. Therefore, for example, the remainder value $P_0^{(0)}$ is set in the remainder operation unit 35-0, and the remainder value $P_1^{(0)}$ is set in the remainder operation unit 35-1.

The remainder operation units 35-0 to 35-X correspond to the sub-blocks 0 to M−1 respectively. When decoded bits in the sub-blocks are input from the comparison units 26-0 to 26-X, the remainder operation units 35-0 to 35-X use the remainder value $P_m^{(0)}$ as the initial value to calculate an L-bit remainder value for each sub-block and acquire a "partial remainder" corresponding to each sub-block. The remainder operation units 35-0 to 35-X output the acquired partial remainders to the addition unit 41. In other words, the remainder operation unit 35-0 outputs the partial remainder corresponding to the sub-block 0 to the addition unit 41, and the remainder operation unit 35-1 outputs the partial remainder corresponding to the sub-block 1 to the addition unit 41. The remainder operation unit 35-X outputs the partial remainder corresponding to the sub-block M−1 to the addition unit 41.

On the other hand, when decoded bits in the sub-blocks are not input from the comparison units 26-0 to 26-X, the remainder operation units 35-0 to 35-X do not calculate remainder values (i.e., do not acquire partial remainders).

Figure 7:
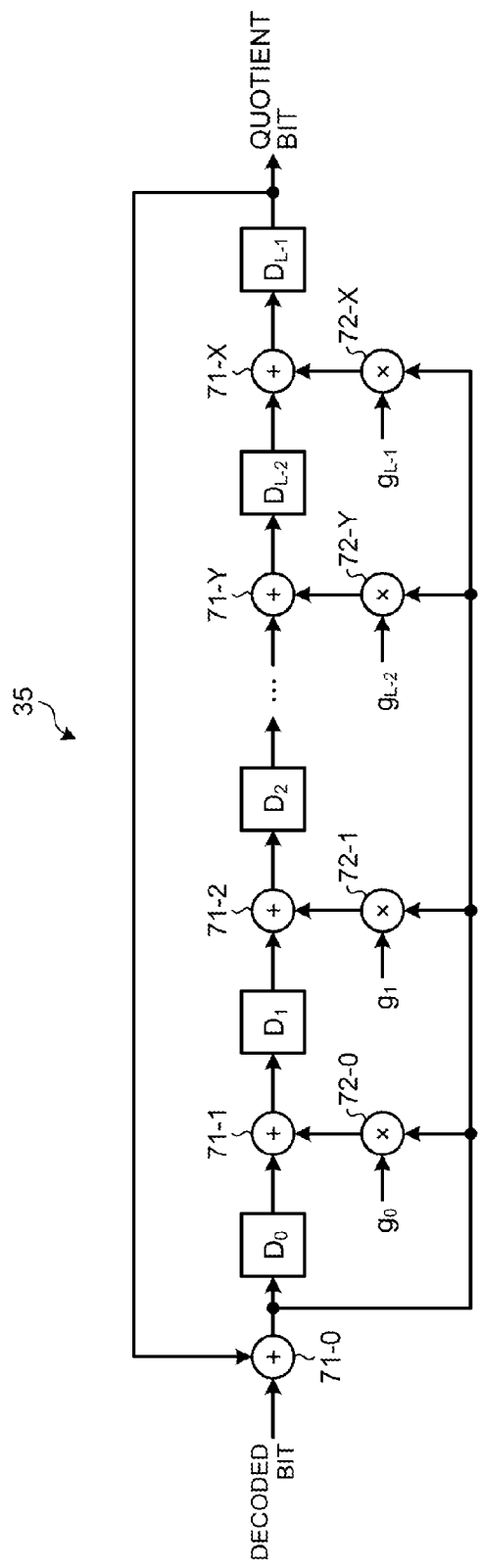
FIG. 7 is a functional block diagram of an example of a remainder operation unit according to the second embodiment.

FIG. 7 is a functional block diagram of an example of a remainder operation unit according to the second embodiment. A remainder operation unit 35 illustrated in FIG. 7 corresponds to the remainder operation units 35-0 to 35-X illustrated in FIG. 6.

As illustrated in FIG. 7, the remainder operation unit 35 includes adders 71-0 to 71-X, delay units $D_0$ to $D_{L-1}$, and multipliers 72-0 to 72-X. In FIG. 7, "X=L−1" and "Y=L−2". Values $g_0$ to $g_{L-1}$ illustrated in FIG. 7 correspond to $g_0$ to $g_{L-1}$ in Equation (2), and $g_0$ to $g_{L-1}$ are "1" or "0".

First of all, each bit of L-bit remainder values $P_m^{(0)}$ including bit 0 to bit L−1 acquired by the remainder acquisition units 31-0 to 31-X is set as an initial value in the delay units $D_0$ to $D_{L-1}$ of the remainder operation unit 35. The decoded bits included in each sub-block are input to the remainder operation unit 35 one by one in a serial order from the first bit. When an input of all the decoded bits is complete for each sub-block, a quotient bit is obtained as a division result obtained at the time of dividing the decoded bit stream in each sub-block by the generator polynomial G(x). Each content of the delay units $D_0$ to $D_{L-1}$ when the input of all the decoded bits is complete for each sub-block becomes a partial remainder $P_m$ for each sub-block. Therefore, the remainder operation unit 35 outputs the contents of the delay units $D_0$ to $D_{L-1}$ as the partial remainders $P_m$ for each sub-block to the addition unit 41 when the input of all the decoded bits is complete for each sub-block. The division using the adders, the delay units, and the multipliers performed on the bits input thereto in a serial order one by one may be called "serial division".

In this way, the error detection unit 7-2 performs error detection by simultaneously acquiring partial remainders for each M sub-blocks of the sub-blocks 0 to M−1 in parallel. Therefore, because the processing time for the error detection can be reduced, the decoding unit 6 can early stop the decoding.

The addition unit 41, the storage unit 42, and the error determination unit 43 are the same as these of the first embodiment, and therefore explanation thereof is omitted.

As explained above, in the error detection unit 7-2, the partial-remainder acquisition units 51-0 to 51-X calculate remainder values corresponding to the sub-blocks 0 to M−1 respectively, in which W bits (where W is "2" or more) are set as a block size, by using the configuration illustrated in FIG. 7, and acquire partial remainders corresponding to the sub-blocks 0 to M−1, respectively. The error determination unit 43 determines whether an error occurs in the decoded bit stream based on the total remainder in which the acquired partial remainders are added. However, the partial-remainder acquisition units 51-0 to 51-X acquire only a partial remainder corresponding to a sub-block including bits in which values are changed between the previous decoding and the current decoding, based on respective comparison results in the comparison units 26-0 to 26-X. In other words, the partial-remainder acquisition units 51-0 to 51-X acquire, from among the sub-blocks, a partial remainder corresponding to a sub-block including bits in which values are different between the previous decoded bit stream and the current decoded bit stream. On the other hand, the partial-remainder acquisition units 51-0 to 51-X do not acquire, from among the sub-blocks, a partial remainder corresponding to a sub-block in which all the bits between the previous decoded bit stream and the current decoded bit stream are the same as each other. The error determination unit 43 determines whether an error occurs in the current decoded bit stream based on the current total remainder in which the acquired partial remainder is added to the previous total remainder.

By doing this, the error detection can be performed on the current decoded bit stream without acquiring the partial remainders corresponding to the sub-block in which values of all the bits are not changed between the previous decoding and the current decoding. Therefore, the throughput related to error detection can be reduced.

Processing of Error Detection Device

Figure 8:
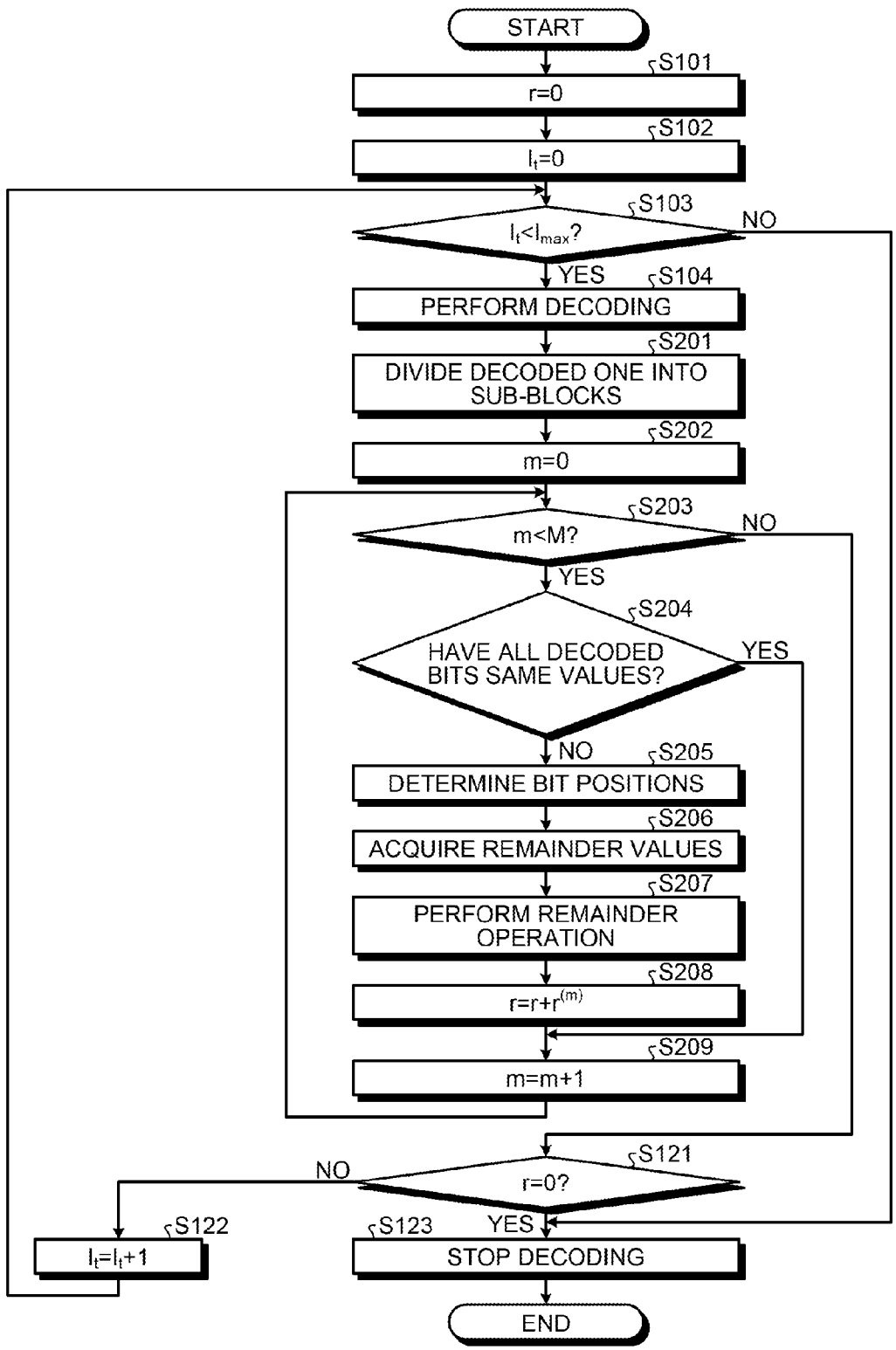
FIG. 8 is a flowchart for explaining the processing of a decoding device according to the second embodiment.

FIG. 8 is a flowchart for explaining the processing of the decoding device according to the second embodiment. The flowchart illustrated in FIG. 8 is started when the encoded bit stream corresponding to the information bit stream of one block is decoded. The processing of Steps S101 to S104 in FIG. 8 are the same as these of the first embodiment, and therefore explanation thereof is omitted.

At Step S201, the decoding device 5 divides the decoded bit stream into M sub-blocks (Step S201).

Subsequently, the decoding device 5 resets the value of a counter m to 0 and sets a sub-block number m to 0 (Step S202).

The decoding device 5 then determines whether the value of m is less than M (Step S203).

When the value of m is less than M (Yes at Step S203), the decoding device 5 determines whether the values of all the current decoded bits are the same as the values of all the previous decoded bits in a sub-block m (Step S204).

When the values of all the current decoded bits are the same as the values of all the previous decoded bits in the sub-block m (Yes at Step S204), the processing of Steps S205 to S208 is not performed, and the processing proceeds to Step S209.

When there are decoded bits in which the current value is different from the previous value in the sub-block m (No at Step S204), the decoding device 5 determines a normal bit position of the first decoded bit in the sub-block m (Step S205).

Subsequently, the decoding device 5 acquires the remainder value corresponding to the bit position determined at Step S205 (Step S206).

The decoding device 5 then uses the remainder value acquired at Step S205 as the initial value to perform the remainder operation on the sub-block m, and acquires a partial remainder $r^{(m)}$ corresponding to the sub-block m (Step S207).

Subsequently, the decoding device 5 adds the partial remainder $r^{(m)}$ to the total remainder r to calculate a new total remainder r (Step S208).

Subsequently, the decoding device 5 increments the value of the counter m (i.e., the sub-block number m) by 1 (Step S209), and the processing returns to Step S203.

Then, when the processing of Steps S204 to S208 is repeated by M times and the value of m becomes M or more (No at Step S203), the decoding device 5 determines whether an error occurs in the decoded bit stream based on the total remainder r (Step S121). The subsequent processing is the same as the first embodiment, and therefore explanation thereof is omitted.

[c] Third Embodiment

The remainder operation for calculating the remainder value R(x) when the polynomial A(x) illustrated in Equation (4) is divided by the generator polynomial G(x) becomes "linear operation" as illustrated in Equation (7). Therefore, a third embodiment is configured to reverse an execution order of the remainder operation and the cumulative addition according to the second related technology at the time of acquiring a partial remainder. In other words, in the third embodiment, the partial remainder is acquired by calculating a cumulative addition result of each remainder value for each bit position and then dividing the cumulative addition result by the generator polynomial. Thereby the number of remainder operations can be reduced as compared with the second related technology.

When an arbitrary index number n is the sum of two integers Q and q and is expressed by "n=Q+q", the remainder value $R_n(x)$ with respect to the monomial can be expressed by Equation (22).

$$R_n(x)=x^n \bmod G(x)=x^{Q+q} \bmod G(x)=((x^Q \bmod G(x)) \times x^q) \bmod G(x) \quad (22)$$

Multiplication of the polynomial A(x) by a monomial $x^q$ is equal to addition of the powers of terms of A(x) by q, as illustrated in Equation (23).

$$x^q A(x)=x^q(a_N x^N+ \ldots +a_1 x+a_0)=a_N x^{N+q}+ \ldots + a_1 x^{1+q}+a_0 x^q \quad (23)$$

Vector representation in Equation (23) corresponds to $\tilde{a}_q$ obtained by shifting an index a by q, as illustrated in Equation (24).

$$a=(a_0, a_1, \cdots a_{N-1}) \to \tilde{a}_q = \left( \underbrace{0, \cdots, 0}_{q}, a_0, a_1, \cdots, a_{N-1}, 0, \cdots, 0 \right) \quad (24)$$

Therefore, a remainder vector $r_{Q+q}$ equivalent to the remainder value $R_n(x)$ illustrated in Equation (22) can be expressed by Equation (25) by using a shift vector $\tilde{r}_{Q+q}$ obtained by shifting a reference remainder vector $r_Q$ by q and $G_r$ illustrated in Equation (10).

$$r_{Q+q}=G_r \tilde{r}_{Q+q} \quad (25)$$

In the third embodiment, therefore, the index number $n_i$ is decomposed into "$Q_i+q_i=p_i \times P+q_i$", and a remainder value $r_{p_i \times P}$ acquired based on $p_i \times P$ is shifted by $q_i$ bits as illustrated in Equation (26) to obtain a shift result $\tilde{r}^{(q_i)}_{p_i \times P}$. In other words, by embedding $q_i$ pieces of 0 in the head of the remainder vector $r_{p_i \times P}$, the remainder vector $r_{p_i \times P}$ is transformed to a remainder vector $\tilde{r}^{(q_i)}_{p_i \times P}$.

$$r_{p_i \times P} \to \tilde{r}^{(q_i)}_{p_i \times P} = \left( \underbrace{0, \cdots, 0}_{q_i}, r_{p \times P,0}, r_{p \times P,1}, \cdots, r_{p \times P,L-1}, 0, \cdots, 0 \right) \quad (26)$$

Subsequently, the shift result illustrated in Equation (26) is cumulatively added according to Equation (27).

$$\tilde{r}=\tilde{r}+\tilde{r}^{(q_i)}_{p_i \times P} \quad (27)$$

The remainder operation is performed on the cumulative addition result $\tilde{r}$ according to Equation (28) to calculate a remainder vector r. Equation (28) represents a case where the remainder operation is performed using a matrix F instead of a matrix Gr. "F" in Equation (28) is a submatrix obtained by extracting a part of Gr, and its extraction size is equal to the size of the shift vector $\tilde{r}_{Q+q}$. The maximum value of a shift amount is previously defined, and therefore by matching the size of the shift vector to the maximum value of the shift amount, F can be set as a fixed matrix regardless of the shift amount.

$$r=F \tilde{r} \quad (28)$$

Components of Equation (28) are indicated as illustrated in Equation (29).

$$\begin{cases} r_0 = f_{00}\tilde{r}_0 + f_{01}\tilde{r}_1 + \cdots + f_{0,L+P-2}\tilde{r}_{L+P-2} \\ r_1 = f_{10}\tilde{r}_0 + f_{11}\tilde{r}_1 + \cdots + f_{1,L+P-2}\tilde{r}_{L+P-2} \\ \vdots \\ r_{L-1} = f_{L-10}\tilde{r}_0 + f_{L-11}\tilde{r}_1 + \cdots + f_{L-1,L+P-2}\tilde{r}_{L+P-2} \end{cases} \quad (29)$$

If a transformation matrix G is used for calculating a remainder value $r_{n+1}$ corresponding to an index number n+1 from a remainder value $r_n$ corresponding to an arbitrary index number n, then the remainder value $r_{n+1}$ is expressed by Equation (30). By using the transformation matrix G, shifting of the remainder value $r_n$ and a remainder operation for the shift result are collectively performed, and the remainder value $r_{n+1}$ is calculated.

$$r_{n+1} = G r_n \quad (30)$$

When the index number n is decomposed into "p×P+q", Equation (30) is expressed by Equation (31).

$$r_n = r_{p \times P + q} = G^q r_{p \times P} \quad (31)$$

Therefore, in the third embodiment, remainder values corresponding to all the index numbers are calculated according to Equation (31). A transformation matrix $G^q$ in Equation (31) is an L×L submatrix of the matrix F in Equation (28). Therefore, when the matrix F in Equation (28) is expressed by Equation (32), the transformation matrix $G^q$ is expressed by Equation (33).

$$F = [f_0, f_1, \ldots, f_{p+L-2}] \quad (32)$$

$$G^q = [f_q, \ldots, f_{q+L-1}] \quad (33)$$

Here, the remainder value $r_n$ is expressed by Equation (34) using the remainder value that specifies the number of shifts and the matrix F.

$$r_n = F \tilde{r}_{p \times P}^{(q)} \quad (34)$$

Transformation between $\tilde{r}^{(q)}_{p \times P}$ and $r_{p \times P}$ is expressed as a matrix operation illustrated in Equation (35).

$$\tilde{r}_{p \times P}^{(q)} = S^{(q)} r_{p \times P} S^{(q)} = \begin{bmatrix} O_{q \times L} \\ I_L \\ O_{(P+L-q-1) \times L} \end{bmatrix} \quad (35)$$

As a result, the remainder value $r_n$ can be expressed by Equation (36) using the transformation matrix $G^q$.

$$r_n = F S^{(q)} r_{p \times P} \; G^q = F S^{(q)} = F \begin{bmatrix} O_{q \times L} \\ I_L \\ O_{(P+L-q-1) \times L} \end{bmatrix} = [f_q, \cdots, f_{q+L-1}] \quad (36)$$

Therefore, in third embodiment, the remainder vector $r_{pi \times P}$ is cumulatively added for each qi according to Equation (37).

$$r^{(qi)} = r^{(qi)} + r_{pi \times P} \quad (37)$$

In other words, in the third embodiment, the cumulative addition illustrated in Equation (38) is performed, and a cumulative addition result $r^{(q)}$ is calculated for each q.

$$r^{(q)} = \sum_{i:q_i = q} a_{p_i \times P + q_i} r_{p_i \times P} \quad (38)$$

The shift processing for shifting the cumulative addition result by q bits for each q and the remainder operation for calculating a remainder value when the shift result is divided by the generator polynomial are performed according to Equation (39) using the transformation matrix $G^q$, and a remainder value $r^{[g]}$ for each q is calculated as a partial remainder.

$$r^{[q]} = G^q r^{(q)} \quad (39)$$

Components of Equation (39) are indicated as illustrated in Equation (40).

$$\begin{cases} r_0^{[q]} = g_{00} r_0^{(q)} + g_{01} r_1^{(q)} + \cdots + g_{0,L-1} r_{L-1}^{(q)} \\ r_1^{(q)} = g_{10} r_0^{(q)} + g_{11} r_1^{(q)} + \cdots + g_{1,L-1} r_{L-1}^{(q)} \\ \vdots \\ r_{L-1}^{(q)} = g_{L-1,0} r_0^{(q)} + g_{L-11} r_1^{(q)} + \cdots + g_{L-1,L-1} r_{L-1}^{(q)} \end{cases} \quad (40)$$

Configuration of Error Detection Unit

Figure 9:
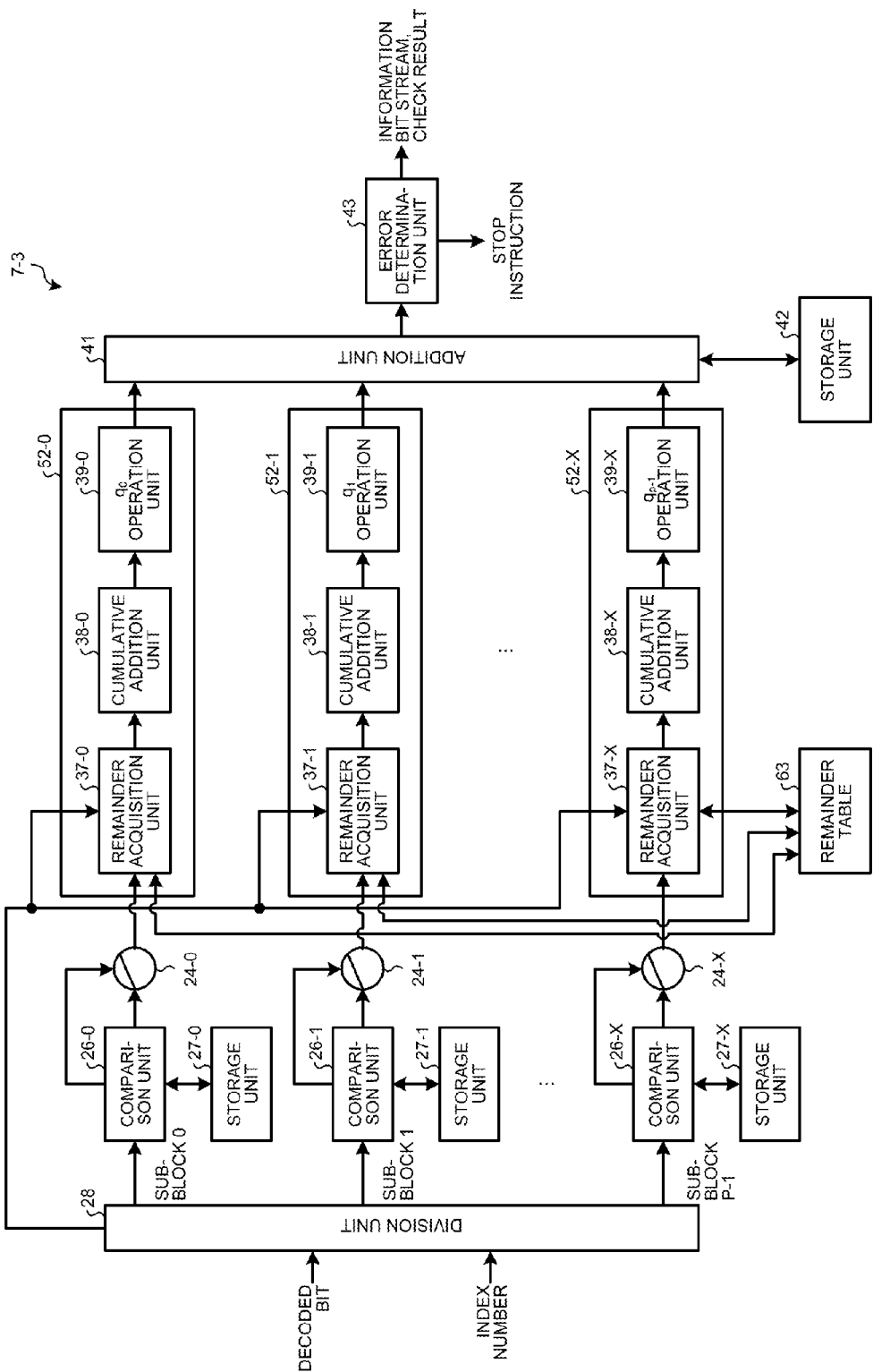
FIG. 9 is a functional block diagram of an example of an error detection unit according to a third embodiment.

FIG. 9 is a functional block diagram of an example of an error detection unit according to the third embodiment. As illustrated in FIG. 9, an error detection unit 7-3 includes a division unit 28, the comparison units 26-0 to 26-X, the storage units 27-0 to 27-X, the switches 24-0 to 24-X, and partial-remainder acquisition units 52-0 to 52-X. The partial-remainder acquisition unit 52-0 includes a remainder acquisition unit 37-0, a cumulative addition unit 38-0, and a $q_0$ operation unit 39-0. The partial-remainder acquisition unit 52-1 includes a remainder acquisition unit 37-1, a cumulative addition unit 38-1, and a $q_1$ operation unit 39-1. The partial-remainder acquisition unit 52-X includes a remainder acquisition unit 37-X, a cumulative addition unit 38-X, and a $q_{p-1}$ operation unit 39-X. In FIG. 9, "X=P–1". "P" is the predetermined bit interval indicated when the index numbers n in the decoded bit stream are decomposed into "p×P+q". The error detection unit 7-3 also includes a remainder table 63, the addition unit 41, the storage unit 42, and the error determination unit 43. The error detection unit 7-3 illustrated in FIG. 9 corresponds to the error detection unit 7 illustrated in FIG. 1.

Each decoded bit $a_{ni}$ in the decoded bit stream is input to the division unit 28 and the index number $n_i$ indicating the normal bit position of each decoded bit $a_{ni}$ is also input thereto (i=0, 1, 2, . . . , K–1). The division unit 28 decomposes the index numbers $n_i$ into "$p_i \times P + q_i$" ($p_i$=0, 1, 2, . . . , K–1, $q_i$=0, 1, 2, . . . , P–1). The division unit 28 divides the decoded bit streams $a_{n0}$ to $a_{nK-1}$ corresponding to the information bit stream of one block into a plurality of sub-blocks i (i=0, 1, 2, . . . , P–1) according to $q_i$ after the decomposition. In other words, the division unit 28 divides the decoded bit streams $a_{n0}$ to $a_{nK-1}$ into the sub-block 0 formed from the decoded bits each in which $q_i$=0, the sub-block 1 formed from the decoded bits each in which $q_i$=1, and the sub-block P–1 formed from the decoded bits each in which $q_i$=P–1. Therefore, for example, the sub-block 0 is formed from decoded bits $a_{n0}, a_{nP}, a_{n2P}, \ldots, a_{n(K-1)P}$. The division unit 28 outputs the sub-block 0 to the comparison unit 26-0, the sub-block 1 to the comparison unit 26-1, . . . , and the sub-block P–1 to the comparison unit 26-X. The sub-blocks 0 to P–1 are output to the comparison units 26-0 to 26-X in parallel.

The division unit 28 outputs the index numbers of the decoded bits, which are output to the comparison units 26-0 to 26-X in parallel, to the remainder acquisition units 37-0 to 37-X, respectively. For example, the division unit 28 outputs index numbers n0, np, n2P, . . . , n(K−1)p of the decoded bits $a_{n0}$, $a_{nP}$, $a_{n2P}$, . . . , $a_{n(K-1)p}$ forming the sub-block 0, which are output to the comparison unit 26-0, to the remainder acquisition unit 37-0.

The comparison units 26-0 to 26-X and the storage units 27-0 to 27-X correspond to the sub-blocks 0 to P−1 respectively. The comparison units 26-0 to 26-X turn on the switches 24-0 to 24-X for initially obtained decoded bit streams, respectively, of the decoded bit streams iteratively obtained from the likelihood data $y_s$, $y_{p1}$, and $y_{p2}$ corresponding to the information bit stream of one block, so that the comparison units 26-0 to 26-X and the remainder acquisition units 37-0 to 37-X are connected to each other respectively. Thereby the decoded bits of the initially obtained decoded bit stream are output from the comparison units 26-0 to 26-X to the remainder acquisition units 37-0 to 37-X in unit of sub-block without any change, respectively. The comparison units 26-0 to 26-X store the decoded bits of the initially obtained decoded bit stream in the storage units 27-0 to 27-X for each sub-block respectively. Thus, for example, the storage unit 27-0 stores the decoded bits $a_{n0}$, $a_{nP}$, $a_{n2P}$, . . . , and $a_{n(K-1)P}$ that form the sub-block 0.

For the decoded bit streams obtained through the second and subsequent decoding, each of the comparison units 26-0 to 26-X compares the values of the currently obtained decoded bits with the values of the previously obtained decoded bits. The previously obtained decoded bits are stored in the storage units 27-0 to 27-X for each sub-block. When there are decoded bits in which the previous value and the current value are different from each other in each of the sub-blocks corresponding to the comparison units 26-0 to 26-X respectively, the comparison units 26-0 to 26-X turn on the switches 24-0 to 24-X, so that the comparison units 26-0 to 26-X and the remainder acquisition units 37-0 to 37-X are connected to each other respectively. On the other hand, when there are no decoded bits in which the previous value and the current value are different from each other in each of the sub-blocks corresponding to the comparison units 27-0 to 27-X respectively, that is, when all the previous and current decoded bits in the sub-block have the same values as each other, the comparison units 26-0 to 26-X turn off the switches 24-0 to 24-X, so that the comparison units 26-0 to 26-X and the remainder acquisition units 37-0 to 37-X are not connected to each other respectively. Therefore, when there are decoded bits in which the previous value and the current value are different from each other in each of the sub-blocks, the decoded bits in the sub-blocks are input to the remainder acquisition units 37-0 to 37-X, and the remainder values are acquired by the remainder acquisition units 37-0 to 37-X respectively. On the other hand, when all the previous and current decoded bits in the sub-block have the same values as each other, the decoded bits in the sub-blocks are not input to the remainder acquisition units 37-0 to 37-X, and the remainder values are not acquired by the remainder acquisition units 37-0 to 37-X respectively.

For example, the comparison unit 26-0 turns on the switch 24-0 when there are decoded bits in which the previous value and the current value are different from each other in the sub-block 0. On the other hand, the comparison unit 26-0 turns off the switch 24-0 when the previous values and the current values of all the decoded bits are the same as each other in the sub-block 0. Also for example, the comparison unit 26-1 turns on the switch 24-1 when there are decoded bits in which the previous value and the current value are different from each other in the sub-block 1. On the other hand, the comparison unit 26-1 turns off the switch 24-1 when the previous values and the current values of all the decoded bits are the same as each other in the sub-block 1.

For the second and subsequent decoding, the comparison units 26-0 to 26-X sequentially update the decoded bits in the sub-blocks stored in the storage units 27-0 to 27-X with the decoded bits in the sub-blocks obtained by each decoding, respectively.

There are no previously obtained decoded bits with respect to the decoded bits of the initially obtained decoded bit stream, and, therefore, at the time of the initial decoding, the values of the currently obtained decoded bits do not always coincide with the values of the previously obtained decoded bits.

The remainder table 63 stores only remainder values $r_{pi \times P}$ corresponding to the bit positions "$p_i \times P$" ($p_i$=0, 1, 2, . . . , K−1) having the predetermined bit interval "P", of the L-bit remainder values $r_{ni}$ (which corresponds to the remainder vectors $r_n$ illustrated in Equation (9)) respectively corresponding to the normal bit positions $n_i$ of the bits $a_{ni}$. Where $P=2^m$, i.e., P is a power of two. FIG. 10 is a diagram of an example of a remainder table according to the third embodiment. For example, as illustrated in FIG. 10, the remainder table 63 stores remainder values $r_{p0 \times P}$, $r_{p1 \times P}$, $r_{p2 \times P}$, . . . , $r_{pK-1 \times P}$ corresponding to the bit positions 0, P, 2P, . . . , (K−1)P respectively. The remainder values $r_{ni}$ respectively corresponding to the normal bit positions $n_i$ of the bits $a_{ni}$ can be previously calculated according to Equation (8) and Equation (9). In other words, the remainder table 63 stores only the remainder values, as $r_{p \times P}$, corresponding to the bit positions p×P (p is an integer of 0 or more) having the predetermined bit interval P, of the remainder values $R_n(X)$ when each of monomials $x^n$ corresponding to the bit positions in the bit stream expressed by the polynomial $A(x)$ is divided by the generator polynomial $G(x)$.

The remainder acquisition units 37-0 to 37-X correspond to the sub-blocks 0 to P−1 respectively. The remainder acquisition units 37-0 to 37-X acquire L-bit remainder values from the remainder table 63 based on the index numbers $n_i$ of the decoded bits $a_{ni}$ when the decoded bits are input from the comparison units 26-0 to 26-X. The remainder acquisition units 37-0 to 37-X decompose the input index numbers $n_i$ into "$p_i \times P + q_i$" ($q_i$=0, 1, 2, . . . , P−1), acquire each remainder value corresponding to "$p_i \times P$" from the remainder table 63, and output the remainder values to the cumulative addition units 38-0 to 38-X, respectively. That is, the remainder acquisition units 37-0 to 37-X acquire remainder values $r_{p \times P}$ corresponding to p×P in the normal bit positions p×P+q (q is an integer of 0 or more and less than P) of the decoded bits, from the remainder table 63. The remainder acquisition unit 37-0 outputs the remainder values corresponding to the sub-block 0 to the cumulative addition unit 38-0, and the remainder acquisition unit 37-1 outputs the remainder values corresponding to the sub-block 1 to the cumulative addition unit 38-1. The remainder acquisition unit 37-X also outputs the remainder values corresponding to the sub-block P−1 to the cumulative addition unit 38-X.

The cumulative addition units 38-0 to 38-X correspond to the sub-blocks 0 to P−1 respectively. The cumulative addition unit 38-0 cumulatively adds the remainder values corresponding to the sub-block 0 i.e. the remainder values corresponding to $q_i$=0 of each $p_i$. The cumulative addition unit 38-1 cumulatively adds the remainder values corresponding to the sub-block 1 i.e. the remainder values corresponding to $q_i$=1 of each $p_i$. The cumulative addition unit 38-X cumulatively adds the remainder values corresponding to the sub-block P−1 i.e. the remainder values corresponding to $q_i$=P−1 of each $p_i$. In other words, the cumulative addition units 38-0 to 38-X cumulatively add the remainder values acquired by the remainder acquisition units 37-0 to 37-X for each q, and calculate cumulative addition results for each q, respectively. The cumulative addition unit 38-0 outputs the cumulative addition result corresponding to $q_i$=0 to the $q_0$ operation unit 39-0, and the cumulative addition unit 38-1 outputs the cumulative addition result corresponding to $q_i$=1 to the $q_1$ operation unit 39-1. The cumulative addition unit 38-X outputs the cumulative addition result corresponding to $q_i$=P−1 to the $q_{P-1}$ operation unit 39-X.

The $q_0$ operation unit 39-0 to $q_{P-1}$ operation unit 39-X correspond to the sub-blocks 0 to P−1, respectively. The $q_0$ operation unit 39-0 to the $q_{P-1}$ operation unit 39-X perform remainder operations for calculating L-bit remainder values for each sub-block and acquire "partial remainders" corresponding to the sub-blocks. The $q_0$ operation unit 39-0 performs the remainder operation for calculating a remainder value when a shift result (i.e., cumulative addition result corresponding to $q_i$=0), obtained by shifting the cumulative addition result corresponding to $q_i$=0 by $q_i$=0 bit, is divided by the generator polynomial G(x), and outputs the calculated remainder value as a partial remainder corresponding to the sub-block 0 to the addition unit 41. The $q_1$ operation unit 39-1 performs the remainder operation for calculating a remainder value when a shift result, obtained by shifting the cumulative addition result corresponding to $q_i$=1 by $q_i$=1 bit, is divided by the generator polynomial G(x), and outputs the calculated remainder value as a partial remainder corresponding to the sub-block 1 to the addition unit 41. The $q_{P-1}$ operation unit 39-X performs the remainder operation for calculating a remainder value when a shift result, obtained by shifting the cumulative addition result corresponding to $q_i$=P−1 by $q_i$=P−1 bit, is divided by the generator polynomial G(x), and outputs the calculated remainder value as a partial remainder corresponding to the sub-block P−1 to the addition unit 41. In other words, each of the operation units of the $q_0$ operation unit 39-0 to the $q_{P-1}$ operation unit 39-X performs the remainder operation for calculating a remainder value when the shift result, obtained by shifting the cumulative addition result for each q by each q bit, is divided by the generator polynomial for each q in order to acquire a partial remainder.

Each of the operation units of the $q_0$ operation unit 39-0 to the $q_{P-1}$ operation unit 39-X performs the shift processing for shifting the cumulative addition result by q bits for each q and the remainder operation for calculating a remainder value when the shift result is divided by the generator polynomial are performed for each q according to Equation (31) using the transformation matrix $G^q$ being a submatrix of the matrix F. In other words, each of the operation units of the $q_0$ operation unit 39-0 to the $q_{P-1}$ operation unit 39-X uses the transformation matrix $G^q$ to perform the shifting and the remainder operation collectively.

As explained above, in the error detection unit 7-3, the partial-remainder acquisition units 52-0 to 52-X calculate the remainder values respectively corresponding to the sub-blocks 0 to P−1 by using the configuration illustrated in FIG. 9, and acquire the partial remainders corresponding to the sub-blocks 0 to P−1 respectively. The error determination unit 43 determines whether an error occurs in the decoded bit stream based on the total remainder in which the acquired partial remainders are added. However, the partial-remainder acquisition units 52-0 to 52-X acquire only a partial remainder corresponding to a sub-block including bits in which values are changed between the previous decoding and the current decoding, based on respective comparison results in the comparison units 26-0 to 26-X. In other words, the partial-remainder acquisition units 52-0 to 52-X acquire, from among the sub-blocks, a partial remainder corresponding to a sub-block including bits in which values are different between the previous decoded bit stream and the current decoded bit stream. On the other hand, the partial-remainder acquisition units 52-0 to 52-X do not acquire, from among the sub-blocks, a partial remainder corresponding to a sub-block in which all the bits between the previous decoded bit stream and the current decoded bit stream have the same values as each other. The error determination unit 43 then determines whether an error occurs in the current decoded bit stream based on the current total remainder in which the acquired partial remainder is added to the previous total remainder.

By doing this, the error detection can be performed on the current decoded bit stream without acquiring the partial remainders corresponding to the sub-block in which values of all the bits are not changed between the previous decoding and the current decoding. Therefore, the throughput related to the error detection can be reduced.

Each of the partial-remainder acquisition units 52-0 to 52-X calculates a cumulative addition result of each remainder value in each bit position for each q, and thereafter performs the remainder operation for calculating a remainder value when a shift result, obtained by shifting the cumulative addition result for each q by q bits, is divided by the generator polynomial for each q, and acquires each of the partial remainders corresponding to the sub-blocks 0 to P−1. By doing this, in an operation for each q, the remainder operation is performed only once on one q. In other words, in the operation for each sub-block of the sub-blocks 0 to P−1, only one remainder operation is performed on one sub-block. Therefore, the throughput related to the error detection can be further reduced when the partial remainder is acquired using the remainder values, of the remainder values corresponding to the normal bit positions, corresponding to the bit positions having the predetermined bit interval.

Processing of Error Detection Device

Figure 11:
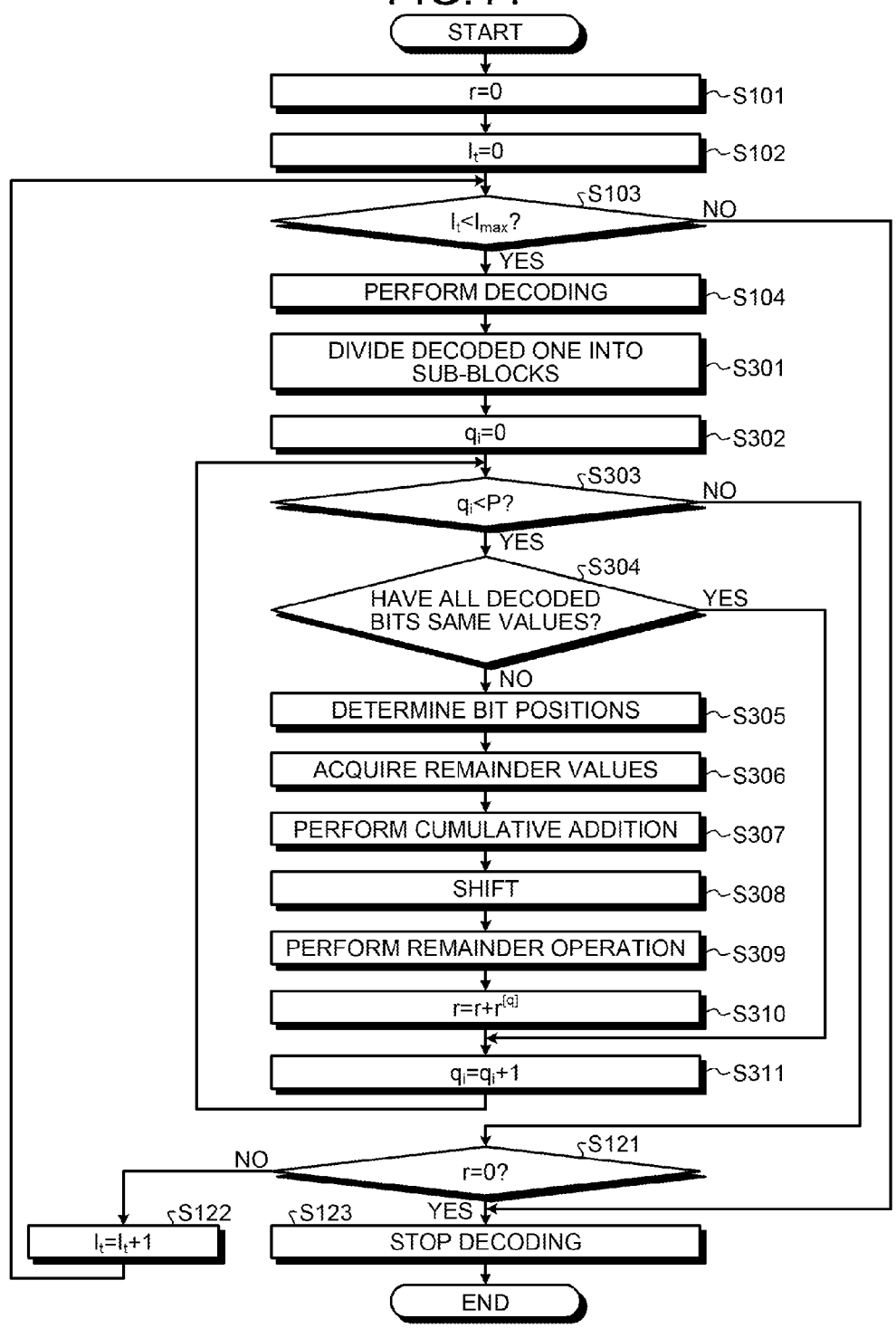
FIG. 11 is a flowchart for explaining the processing of a decoding device according to the third embodiment.

FIG. 11 is a flowchart for explaining the processing of a decoding device according to the third embodiment. The flowchart illustrated in FIG. 11 is started when the encoded bit stream corresponding to the information bit stream of one block is decoded. The processing of Steps S101 to S104 in FIG. 11 are the same as these of the first embodiment, and therefore explanation thereof is omitted.

At Step S301, the decoding device 5 divides the decoded bit stream into P sub-blocks (Step S301).

Subsequently, the decoding device 5 resets the value of a counter $q_i$ to 0 and sets a sub-block number $q_i$ to 0 (Step S302).

The decoding device 5 then determines whether the value of $q_i$ is less than P (Step S303).

When the value of $q_i$ is less than P (Yes at Step S303), the decoding device 5 determines whether the values of all the current decoded bits are the same as the values of all the previous decoded bits in the sub-block $q_i$ (Step S304).

When the values of all the current decoded bits are the same as the values of all the previous decoded bits in the sub-block $q_i$ (Yes at Step S304), the decoding device 5 does not perform the processing of Steps S305 to S310, and the processing proceeds to Step S311.

When there are decoded bits in which the current value is different from the previous value in the sub-block $q_i$ (No at Step S304), the decoding device 5 decomposes the index numbers $n_i$ of the current decoded bits $a_{ni}$ that form the sub-block $q_i$ into "$p_i \times P + q_i$", and determines bit positions of "$p_i \times P$" (Step S305).

Subsequently, the decoding device 5 acquires remainder values $r_{p_i \times P}$ corresponding to the bit positions "$p_i \times P$" determined at Step S305 (Step S306).

The decoding device 5 then cumulatively adds the remainder values $r_{p_i \times P}$ acquired at Step S306 for the sub-block $q_i$ (Step S307).

Subsequently, the decoding device 5 performs the shift processing for shifting the cumulative addition result for the sub-block $q_i$ by q bits and the remainder operation for calculating a remainder value when the shift result is divided by the generator polynomial, by using the transformation matrix $G^q$, and acquires the partial remainder $r^{[q]}$ corresponding to the sub-block $q_i$ (Steps S308, S309).

Subsequently, the decoding device 5 adds the partial remainder $r^{[q]}$ to the total remainder r to calculate a new total remainder r (Step S310).

The decoding device 5 then increments the value of the counter $q_i$ (i.e., the sub-block number $q_i$) by 1 (Step S311), and the processing returns to Step S303.

Then, when the processing of Steps S304 to S310 is repeated by P times and the value of $q_i$ becomes P or more (No at Step S303), the decoding device 5 determines whether an error occurs in the decoded bit stream based on the total remainder r (Step S121). The subsequent processing is the same as the first embodiment, and therefore explanation thereof is omitted.

[d] Other Embodiments

Figure 12:
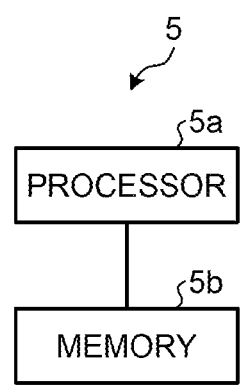
FIG. 12 is a diagram of a hardware configuration example of the decoding device.

1. The decoding device 5 according to the embodiments can be implemented by the following hardware configuration. FIG. 12 is a diagram of a hardware configuration example of the decoding device. As illustrated in FIG. 12, the decoding device 5 includes a processor 5a and a memory 5b as components of the hardware. Examples of the processor 5a include, but are not limited to, a central processing unit (CPU), a digital signal processor (DSP), and a field programmable gate array (FPGA). The decoding device 5 may also include a large scale integrated circuit (LSI) including the processor 5a and a peripheral circuit. Examples of the memory 5b include, but are not limited to, a RAM such as SDRAM, a ROM, and a flash memory. In the decoding unit 6 provided in the decoding device 5, the distribution unit 11, the element decoding units 12 and 13, the hard decision unit 16, and the index number output unit 17 are implemented by the processor 5a. The interleaver 14 and the deinterleaver 15 are implemented by the processor 5a and the memory 5b. In the error detection units 7-1 to 7-3 provided in the decoding device 5, the division unit 21, the comparison units 22-0 to 22-X, the switches 24-0 to 24-X, the remainder acquisition units 31-0 to 31-X, the addition unit 41, and the error determination unit 43 are implemented by the processor 5a. The storage units 23-0 to 23-X and 42, and the remainder table 61 are implemented by the memory 5b. The division unit 25, the comparison units 26-0 to 26-X, the remainder acquisition units 34-0 to 34-X, and the remainder operation units 35-0 to 35-X are implemented by the processor 5a. The storage units 27-0 to 27-X, and the remainder tables 61, 62, and 63 are implemented by the memory 5b. The division unit 28, the remainder acquisition units 37-0 to 37-X, and the $q_0$ operation unit 39-0 to the $q_{p-1}$ operation unit 39-X are implemented by the processor 5a.

The cumulative addition units 38-0 to 38-X are implemented by the processor 5a and the memory 5b.

2. The processings in the explanation of the decoding device 5 may be implemented by causing the processor 5a to execute programs corresponding to the processings. For example, it may be configured that the programs corresponding to the processings in the explanation of the decoding device 5 are stored in the memory 5b and are read from the memory 5b by the processor 5a to be executed.

3. In the embodiments, the case where the turbo code is used as FEC has been explained. However, the disclosed technology can also be applied to a case where low density parity check (LDPC) codes are used as FEC.

4. In the embodiments, the case where the FEC is used as error control technology has been explained. However, the disclosed technology can also be applied to a case where Automatic Repeat reQuest (ARQ) is used as the error control technology. In ARQ, the error detection unit in the decoding device outputs a retransmission request of an encoded bit stream when an error occurs in a decoded bit stream and stops outputting the retransmission request when no error occurs in the decoded bit stream. The retransmission request is transmitted from the wireless reception device to the wireless transmission device. The wireless transmission device retransmits the encoded bit stream to the wireless reception device according to the retransmission request. Therefore, the decoding device in the ARQ iteratively performs decoding on the same encoded bit stream transmitted by the wireless transmission device until no error is detected in the decoded bit stream. As explained above, the decoding device in the ARQ and the decoding device that performs the turbo decoding have the same point that the decoding for the same encoded bit stream transmitted by the wireless transmission device is iteratively performed.

According to the disclosed aspect, the throughput related to the error detection can be reduced.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A decoding device comprising:
   a decoding unit that iteratively performs decoding on a same encoded bit stream transmitted by a wireless transmission device to iteratively obtain a decoded bit stream corresponding to an information bit stream of one block; and
   an error detection unit that divides the decoded bit stream into a plurality of sub-blocks, acquires a plurality of partial remainders respectively corresponding to the sub-blocks, and determines whether an error occurs in the decoded bit stream based on a total remainder in which the partial remainders are added, wherein
   the error detection unit acquires, from among the sub-blocks, a first partial remainder corresponding to a first sub-block including bits in which values are different between a previous decoded bit stream and a current decoded bit stream, but does not acquire a second partial remainder corresponding to a second sub-block in which all bits have same values between the previous decoded bit stream and the current decoded bit stream, and determines whether the error occurs in the current decoded bit stream based on a current total remainder obtained by adding the acquired first partial remainder to a previous total remainder.

2. The decoding device according to claim 1, wherein the decoding unit stops the decoding when no error is determined in the decoded bit stream.

3. The decoding device according to claim 1, wherein the error detection unit outputs a retransmission request of the encoded bit stream when any error occurs in the decoded bit stream, and stops outputting the retransmission request when no error is determined in the decoded bit stream.

4. The decoding device according to claim 1, further comprising a table that stores a remainder value when each of monomials respectively corresponding to bit positions in a bit stream expressed by a polynomial is divided by a generator polynomial for generating an error detection code, wherein
the error detection unit, as the first partial remainder, acquires the remainder value corresponding to a normal bit position of the bit, of the bits included in the first sub-block, in which values are different between the previous decoded bit stream and the current decoded bit stream from the table.

5. The decoding device according to claim 1, further comprising a table that stores an initial value of a remainder value corresponding to each of the sub-blocks, wherein
the error detection unit, as the first partial remainder, acquires a remainder value when the first sub-block is divided by a generator polynomial for generating an error detection code using the initial value.

6. The decoding device according to claim 1, further comprising a table that stores a first remainder value corresponding to each of bit positions p×P (p is an integer of 0 or more) having a predetermined bit interval P, of remainder values when each of monomials respectively corresponding bit positions in a bit stream expressed by a polynomial is divided by a generator polynomial for generating an error detection code, wherein the error detection unit acquires, from the table, the first remainder values corresponding to p×P in normal bit positions p×P+q (q is an integer of 0 or more and less than P) of bits, of the bits included in the first sub-block, in which values are different between the previous decoded bit stream and the current decoded bit stream, cumulatively adds the acquired first remainder values to calculate a cumulative addition result, and then acquires a second remainder value, as the first partial remainder, when a shift result obtained by shifting the cumulative addition result by q bit is divided by the generator polynomial.

7. An error detection method executed by a decoding device including:
a decoding unit that iteratively performs decoding on a same encoded bit stream transmitted by a wireless transmission device to iteratively obtain a decoded bit stream corresponding to an information bit stream of one block; and an error detection unit that divides the decoded bit stream into a plurality of sub-blocks, acquires a plurality of partial remainders respectively corresponding to the sub-blocks, and determines whether an error occurs in the decoded bit stream based on a total remainder in which the partial remainders are added, the error detection method comprising:

acquiring, from among the sub-blocks, a first partial remainder corresponding to a first sub-block including bits in which values are different between a previous decoded bit stream and a current decoded bit stream, but not acquiring a second partial remainder corresponding to a second sub-block in which all bits have same values between the previous decoded bit stream and the current decoded bit stream; and determining whether the error occurs in the current decoded bit stream based on a current total remainder obtained by adding the acquired first partial remainder to a previous total remainder.

* * * * *